United States Patent
Ogawa et al.

(10) Patent No.: US 12,278,108 B2
(45) Date of Patent: Apr. 15, 2025

(54) SUBSTRATE PROCESSING METHOD, METHOD OF MANUFACTURING SEMICONDUCTOR DEVICE, NON-TRANSITORY COMPUTER-READABLE RECORDING MEDIUM AND SUBSTRATE PROCESSING APPARATUS

(71) Applicant: Kokusai Electric Corporation, Tokyo (JP)

(72) Inventors: Arito Ogawa, Toyama (JP); Kota Kowa, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 382 days.

(21) Appl. No.: 17/697,428

(22) Filed: Mar. 17, 2022

(65) Prior Publication Data
US 2022/0216061 A1     Jul. 7, 2022

Related U.S. Application Data

(63) Continuation of application No. PCT/JP2019/036603, filed on Sep. 18, 2019.

(51) Int. Cl.
*H01L 21/28* (2006.01)
*C23C 16/455* (2006.01)
(Continued)

(52) U.S. Cl.
CPC .. *H01L 21/28568* (2013.01); *C23C 16/45534* (2013.01); *C23C 16/45544* (2013.01); *C23C 16/52* (2013.01)

(58) Field of Classification Search
CPC ......... H01L 21/28568; C23C 16/45534; C23C 16/45544; C23C 16/52
(Continued)

(56) References Cited

U.S. PATENT DOCUMENTS

2006/0273426 A1  12/2006  Iijima
2013/0137262 A1   5/2013  Satoh
(Continued)

FOREIGN PATENT DOCUMENTS

JP   2003-247071 A    9/2003
JP   2006-324363 A   11/2006
(Continued)

OTHER PUBLICATIONS

Japanese Office Action issued on Sep. 30, 2022 for Japanese Patent Application No. 2021-546111.
(Continued)

*Primary Examiner* — Ori Nadav
(74) *Attorney, Agent, or Firm* — Volpe Koenig

(57) ABSTRACT

There is provided a technique capable of forming a sufficiently flat film. According to one aspect of the technique, there is provided a substrate processing method including: forming a metal-containing multi-layer film structure on a substrate by alternately performing: (a) forming a metal-containing film on the substrate; and (b) supplying a process gas to the substrate so as to perform one or both of (b-1) forming a crystal layer separation film to a surface of the metal-containing film and (b-2) removing abnormal growth nuclei at the surface of the metal-containing film.

17 Claims, 10 Drawing Sheets

(51) Int. Cl.
   *C23C 16/52* (2006.01)
   *H01L 21/285* (2006.01)
(58) Field of Classification Search
   USPC .......................................................... 438/656
   See application file for complete search history.

(56) References Cited

U.S. PATENT DOCUMENTS

| | | |
|---|---|---|
| 2014/0170320 A1 | 6/2014 | Yamamoto et al. |
| 2015/0050806 A1 | 2/2015 | Park et al. |
| 2015/0303101 A1 | 10/2015 | Blomberg et al. |
| 2018/0061648 A1 | 3/2018 | Blomberg et al. |
| 2018/0135169 A1* | 5/2018 | Ishizaka .................. C23C 16/52 |
| 2020/0194269 A1 | 6/2020 | Ogawa et al. |

FOREIGN PATENT DOCUMENTS

| | | |
|---|---|---|
| JP | 2011-066263 A | 3/2011 |
| JP | 2011-119433 A | 6/2011 |
| JP | 2015-514161 A | 5/2015 |
| JP | 2017-521549 A | 8/2017 |
| JP | 2018-080349 A | 5/2018 |
| KR | 101189642 B1 | 10/2012 |
| KR | 20140079295 A | 6/2014 |
| KR | 20160145165 A | 12/2016 |
| KR | 20180054476 A | 5/2018 |
| TW | 201350607 A | 12/2013 |
| TW | 201542856 A | 11/2015 |
| TW | 201829828 A | 8/2018 |
| WO | 2019/058608 A1 | 3/2019 |

OTHER PUBLICATIONS

Singapore Search Report & Written Opinion issued on Aug. 29, 2023 for Singapore Patent Application No. 11202202656Y.
Taiwan Office Action issued on Feb. 1, 2024 for Taiwan Patent Application No. 111147561.
Taiwan Office Action, TW Application No. 109129498, Apr. 1, 2021, 14 pages (Japanese and English).
Korean Office Action issued on Apr. 30, 2024 for Korea Patent Application No. 10-2022-7008749.

* cited by examiner

FIG. 10

| | COMPARTIVE EXAMPLE | FIRST EXAMPLE | SECOND EXAMPLE | THIRD EXAMPLE |
|---|---|---|---|---|
| Rms (nm) | 1.62 | 0.91 | 0.80 | 1.00 |
| Rmax (nm) | 25.7 | 9.79 | 9.56 | 11.3 |
| | ABNORMAL GROWTH NUCLEI / TiN FILM | CRYSTAL LAYER SEPARATION FILM / TiN FILM | CRYSTAL LAYER SEPARATION FILM / TiN FILM | TiN FILM |

SUBSTRATE PROCESSING METHOD, METHOD OF MANUFACTURING SEMICONDUCTOR DEVICE, NON-TRANSITORY COMPUTER-READABLE RECORDING MEDIUM AND SUBSTRATE PROCESSING APPARATUS

CROSS-REFERENCE TO RELATED PATENT APPLICATION

This application is a bypass continuation application of PCT International Application No. PCT/JP2019/036603, filed on Sep. 18, 2019, in the WIPO, the entire contents of which are hereby incorporated by reference.

BACKGROUND

1. Field

The present disclosure relates to a substrate processing method, a method of manufacturing a semiconductor device, a non-transitory computer-readable recording medium and a substrate processing apparatus.

2. Related Art

For example, a tungsten film (also simply referred to as a "W film") whose resistance is low is used as a word line of a DRAM or a NAND flash memory of a three-dimensional structure. In addition, according to some related arts, a titanium nitride film (also simply referred to as a "TiN film") serving as a barrier film may be provided between the W film and an insulating film. The TiN film serves to improve the adhesion between the W film and the insulating film, and a nucleation film of growing the W film may be formed on the TiN film.

However, an embedding width of a groove in which the W film is formed is small. Therefore, when the TiN film is not flat, a volume of the W film may decrease. Thereby, it may be difficult to reduce the resistance of the W film.

SUMMARY

According to the present disclosure, there is provided a technique capable of forming a sufficiently flat film.

According to one or more embodiments of the present disclosure, there is provided a technique a substrate processing method including: forming a metal-containing multi-layer film structure on a substrate by alternately performing: (a) forming a metal-containing film on the substrate; and (b) supplying a process gas to the substrate so as to perform one or both of (b-1) forming a crystal layer separation film to a surface of the metal-containing film and (b-2) removing abnormal growth nuclei at the surface of the metal-containing film.

BRIEF DESCRIPTION OF THE DRAWINGS

FIG. 10 is a diagram schematically illustrating a comparison of cross-sections of TiN films formed on a substrate according to a comparative example and first through third examples.

DETAILED DESCRIPTION

Embodiments

Figure 1:
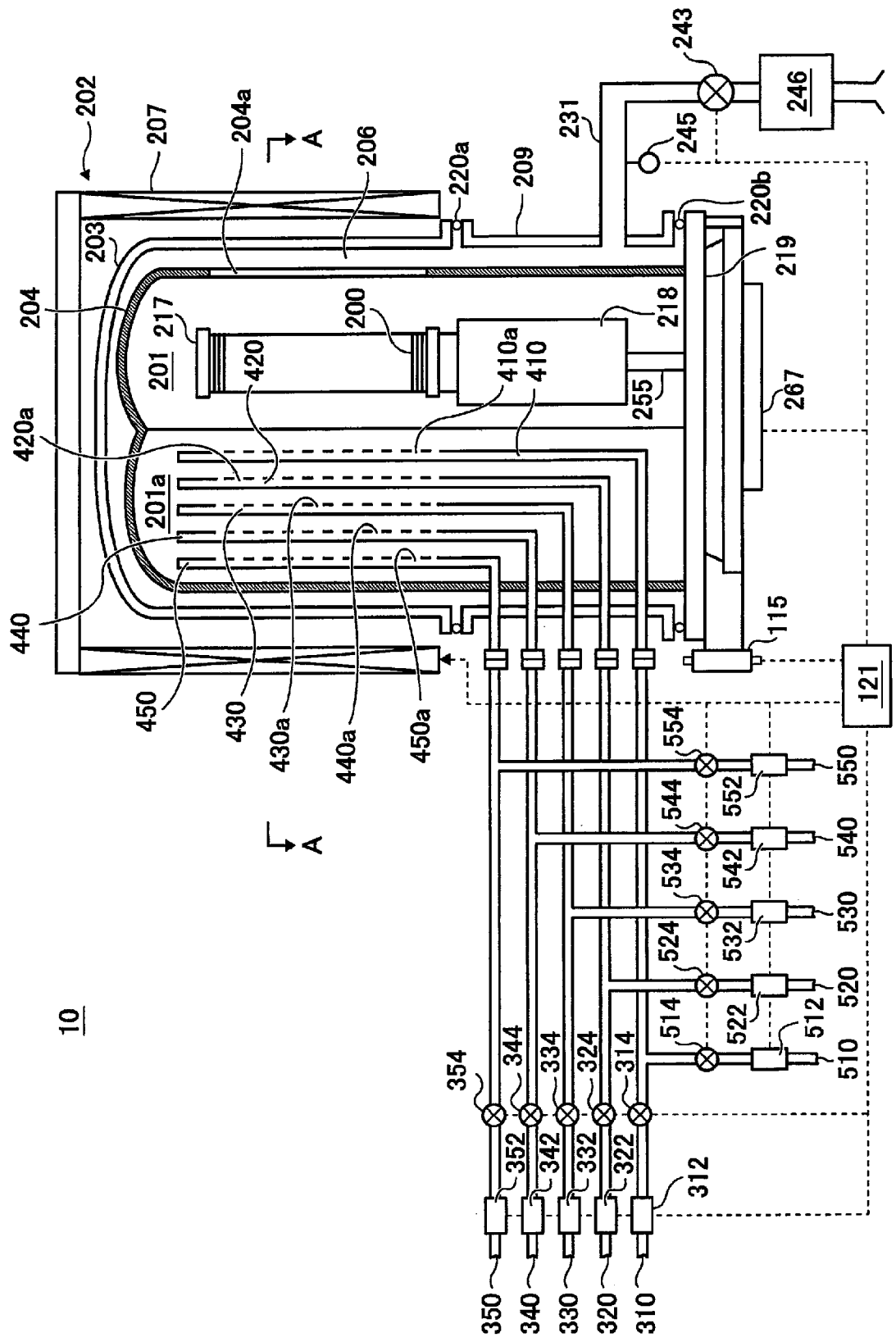
FIG. 1 is a diagram schematically illustrating a vertical cross-section of a vertical type process furnace of a substrate processing apparatus according to one or more embodiments of the present disclosure.

Hereinafter, one or more embodiments (also simply referred to as "embodiments") according to the technique of the present disclosure will be described with reference to FIGS. 1 through 4.

(1) Configuration of Substrate Processing Apparatus

A substrate processing apparatus 10 includes a process furnace 202. The process furnace 202 is provided with a heater 207 serving as a heating apparatus (which is a heating structure or a heating system). The heater 207 is of a cylindrical shape, and is vertically installed while being supported by a heater base (not shown) serving as a support plate.

An outer tube 203 constituting a reaction vessel (which is a process vessel) is provided in an inner side of the heater 207 to be aligned in a manner concentric with the heater 207. For example, the outer tube 203 is made of a heat resistant material such as quartz ($SiO_2$) and silicon carbide (SiC). For example, the outer tube 203 is of a cylindrical shape with a closed upper end and an open lower end. A manifold (which is an inlet flange) 209 is provided under the outer tube 203 to be aligned in a manner concentric with the outer tube 203. For example, the manifold 209 is made of a metal such as stainless steel (SUS). The manifold 209 is of a cylindrical shape with open upper and lower ends. An O-ring 220a serving as a seal is provided between the upper end of the manifold 209 and the outer tube 203. As the manifold 209 is supported by the heater base (not shown), the outer tube 203 is installed vertically.

An inner tube 204 constituting the reaction vessel is provided in an inner side of the outer tube 203. For example, the inner tube 204 is made of a heat resistant material such as quartz ($SiO_2$) and silicon carbide (SiC). For example, the inner tube 204 is of a cylindrical shape with a closed upper end and an open lower end. The process vessel (reaction vessel) is constituted mainly by the outer tube 203, the inner tube 204 and the manifold 209. A process chamber 201 is provided in (or defined by) a hollow cylindrical portion of the process vessel (that is, an inner side of the inner tube 204).

The process chamber 201 is configured to stack and accommodate a plurality of wafers including a wafer 200 serving as a substrate in a horizontal orientation in a multistage manner along a vertical direction by a boat 217 described later. Hereinafter, the plurality of wafers including the wafer 200 may also be simply referred to as wafers 200.

Nozzles 410, 420, 430, 440 and 450 are installed in the process chamber 201 so as to penetrate a side wall of the manifold 209 and the inner tube 204. Gas supply pipes 310, 320, 330, 340 and 350 are connected to the nozzles 410, 420, 430, 440 and 450, respectively. However, the process furnace 202 according to the present embodiments is not limited thereto.

Mass flow controllers (MFCs) 312, 322, 332, 342 and 352 serving as flow rate controllers (flow rate control structures) and valves 314, 324, 334, 344 and 354 serving as opening/closing valves are sequentially installed at the gas supply pipes 310, 320, 330, 340 and 350 in this order from upstream sides to downstream sides of the gas supply pipes 310, 320, 330, 340 and 350, respectively, in a gas flow direction. Gas supply pipes 510, 520, 530, 540 and 550 through which an inert gas is supplied are connected to the gas supply pipes 310, 320, 330, 340 and 350 at downstream sides of the valves 314, 324, 334, 344 and 354, respectively. Mass flow controllers (MFCs) 512, 522, 532, 542 and 552 serving as flow rate controllers (flow rate control structures) and valves 514, 524, 534, 544 and 554 serving as opening/closing valves are sequentially installed at the gas supply pipes 510, 520, 530, 540 and 550 in this order from upstream sides to downstream sides of the gas supply pipes 510, 520, 530, 540 and 550 respectively, in the gas flow direction.

The nozzles 410, 420, 430, 440 and 450 are connected to front ends (tips) of the gas supply pipes 310, 320, 330, 340 and 350, respectively. Each of the nozzles 410, 420, 430, 440 and 450 may be implemented as an L-shaped nozzle, and a horizontal portion of each of the nozzles 410, 420, 430, 440 and 450 is installed so as to penetrate the side wall of the manifold 209 and the inner tube 204. A vertical portion of each of the nozzles 410, 420, 430, 440 and 450 is installed in a spare chamber 201a of a channel shape (a groove shape) protruding outward in a radial direction of the inner tube 204 and extending in the vertical direction. That is, the vertical portion of each of the nozzles 410, 420, 430, 440 and 450 is installed in the spare chamber 201a along an inner wall of the inner tube 204 toward an upper portion of the inner tube 204 (in an upward direction in which the wafers 200 are arranged).

The nozzles 410, 420, 430, 440 and 450 are provided so as to extend from a lower region of the process chamber 201 to an upper region of the process chamber 201, and are provided with a plurality of gas supply holes 410a, a plurality of gas supply holes 420a, a plurality of gas supply holes 430a, a plurality of gas supply holes 440a and a plurality of gas supply holes 450a, respectively, at positions facing the wafers 200. Thereby, a gas such as a process gas is supplied to the wafers 200 through the gas supply holes 410a of the nozzle 410, the gas supply holes 420a of the nozzle 420, the gas supply holes 430a of the nozzle 430, the gas supply holes 440a of the nozzle 440 and the gas supply holes 450a of the nozzle 450. The gas supply holes 410a, the gas supply holes 420a, the gas supply holes 430a, the gas supply holes 440a and the gas supply holes 450a are provided from a lower portion to the upper portion of the inner tube 204. An opening area of each of the gas supply holes 410a, the gas supply holes 420a, the gas supply holes 430a, the gas supply holes 440a and the gas supply holes 450a is the same, and each of the gas supply holes 410a, the gas supply holes 420a, the gas supply holes 430a, the gas supply holes 440a and the gas supply holes 450a is provided at the same pitch. However, the gas supply holes 410a, the gas supply holes 420a, the gas supply holes 430a, the gas supply holes 440a and the gas supply holes 450a are not limited thereto. For example, the opening area of each of the gas supply holes 410a, the gas supply holes 420a, the gas supply holes 430a, the gas supply holes 440a and the gas supply holes 450a may gradually increase from the lower portion to the upper portion of the inner tube 204 to further uniformize a flow rate of the gas supplied through the gas supply holes 410a, the gas supply holes 420a, the gas supply holes 430a, the gas supply holes 440a and the gas supply holes 450a.

The gas supply holes 410a of the nozzle 410, the gas supply holes 420a of the nozzle 420, the gas supply holes 430a of the nozzle 430, the gas supply holes 440a of the nozzle 440 and the gas supply holes 450a of the nozzle 450 are provided from a lower portion to an upper portion of the boat 217 described later. Therefore, the process gas supplied into the process chamber 201 through the gas supply holes 410a of the nozzle 410, the gas supply holes 420a of the nozzle 420, the gas supply holes 430a of the nozzle 430, the gas supply holes 440a of the nozzle 440 and the gas supply holes 450a of the nozzle 450 can be supplied onto the wafers 200 accommodated in the boat 217 from the lower portion to the upper portion thereof, that is, an entirety of the wafers 200 accommodated in the boat 217. The nozzles 410, 420, 430, 440 and 450 may extend from the lower region to the upper region of the process chamber 201. However, it is preferable that the nozzles 410, 420, 430, 440 and 450 may extend to the vicinity of a ceiling of the boat 217.

A source gas containing a metal element (which is a metal-containing gas) serving as the process gas is supplied into the process chamber 201 through the gas supply pipe 310 provided with the MFC 312 and the valve 314 and the nozzle 410. As a source material of the source gas, for example, the source gas contains titanium (Ti) serving as the metal element. For example, as the source material, titanium tetrachloride ($TiCl_4$) serving as a halogen-based source (which is a halide or a halogen-based titanium source material) may be used.

A silicon-containing gas serving as the process gas is supplied into the process chamber 201 through the gas supply pipe 320 provided with the MFC 322 and the valve 324 and the nozzle 420. For example, a silane-based gas or a chlorosilane-based gas may be used as the silicon-containing gas. For example, silane ($SiH_4$) gas may be used as the silane-based gas. For example, hexachlorodisilane ($Si_2Cl_6$) gas may be used as the chlorosilane-based gas. According to the present embodiments, the terms "silane-based gas" or "chlorosilane-based gas" may also refer to a gas constituted by a chemical compound wherein the number of silicon (Si), hydrogen (H) or chlorine (Cl) in its chemical formula is different from that of silane or hexachlorodisilane.

A reactive gas serving as the process gas is supplied into the process chamber 201 through the gas supply pipe 330 provided with the MFC 332 and the valve 334 and the nozzle 430. As the reactive gas, for example, a nitrogen-containing gas containing nitrogen (N) such as ammonia ($NH_3$) gas may be used.

An oxygen-containing gas serving as the process gas is supplied into the process chamber 201 through the gas supply pipe 340 provided with the MFC 342 and the valve 344 and the nozzle 440. For example, a gas such as oxygen ($O_2$) gas, ozone ($O_3$) gas, nitric oxide (NO) gas and nitrous oxide ($N_2O$) gas may be used as the oxygen-containing gas.

A halogen-containing gas serving as the process gas is supplied into the process chamber 201 through the gas supply pipe 350 provided with the MFC 352 and the valve 354 and the nozzle 450. For example, a gas containing a metal element may be used as the halogen-containing gas. For example, tungsten hexafluoride ($WF_6$) gas may be used as the halogen-containing gas. However, a gas such as nitrogen trifluoride ($NF_3$) gas, chlorine trifluoride ($ClF_3$) gas, fluorine ($F_2$) gas and hydrogen fluoride (HF) gas may be used as the halogen-containing gas.

The inert gas such as nitrogen ($N_2$) gas is supplied into the process chamber 201 through the gas supply pipes 510, 520, 530, 540 and 550 provided with the MFCs 512, 522, 532, 542 and 552 and the valves 514, 524, 534, 544 and 554, respectively, and the nozzles 410, 420, 430, 440 and 450. While the present embodiments will be described by way of an example in which the $N_2$ gas is used as the inert gas, the inert gas according to the present embodiments is not limited thereto. For example, instead of the $N_2$ gas, a rare gas such as argon (Ar) gas, helium (He) gas, neon (Ne) gas and xenon (Xe) gas may be used as the inert gas.

A process gas supplier (also referred to as a process gas supply structure or a process gas supply system) is constituted mainly by the gas supply pipes 310, 320, 330, 340 and 350, the MFCs 312, 322, 332, 342 and 352, the valves 314, 324, 334, 344 and 354 and the nozzles 410, 420, 430, 440 and 450. However, only the nozzles 410, 420, 430, 440 and 450 may be considered as the process gas supplier. The process gas supplier may also be simply referred to as a "gas supplier" (which is a gas supply structure or a gas supply system). When the source gas is supplied through the gas supply pipe 310, a source gas supplier (which is a source gas supply structure or a source gas supply system) is constituted mainly by the gas supply pipe 310, the MFC 312 and the valve 314. The source gas supplier may further include the nozzle 410. In addition, when the silicon-containing gas is supplied through the gas supply pipe 320, a silicon-containing gas supplier (which is a silicon-containing gas supply structure or a silicon-containing gas supply system) is constituted mainly by the gas supply pipe 320, the MFC 322 and the valve 324. The silicon-containing gas supplier may further include the nozzle 420. In addition, when the reactive gas is supplied through the gas supply pipe 330, a reactive gas supplier (which is a reactive gas supply structure or a reactive gas supply system) is constituted mainly by the gas supply pipe 330, the MFC 332 and the valve 334. The reactive gas supplier may further include the nozzle 430. When the nitrogen-containing gas serving as the reactive gas is supplied through the gas supply pipe 330, the reactive gas supplier may also be referred to as a nitrogen-containing gas supplier (which is a nitrogen-containing gas supply structure or a nitrogen-containing gas supply system). In addition, when the oxygen-containing gas is supplied through the gas supply pipe 340, an oxygen-containing gas supplier (which is an oxygen-containing gas supply structure or an oxygen-containing gas supply system) is constituted mainly by the gas supply pipe 340, the MFC 342 and the valve 344. The oxygen-containing gas supplier may further include the nozzle 440. In addition, when the halogen-containing gas is supplied through the gas supply pipe 350, a halogen-containing gas supplier (which is a halogen-containing gas supply structure or a halogen-containing gas supply system) is constituted mainly by the gas supply pipe 350, the MFC 352 and the valve 354. The halogen-containing gas supplier may further include the nozzle 450. In addition, an inert gas supplier (which is an inert gas supply structure or an inert gas supply system) is constituted mainly by the gas supply pipes 510, 520, 530, 540 and 550, the MFCs 512, 522, 532, 542 and 552 and the valves 514, 524, 534, 544 and 554.

According to the present embodiments, the gas is supplied through the nozzles 410, 420, 430, 440 and 450 provided in a vertically long annular space (which is defined by the inner wall of the inner tube 204 and edges (peripheries) of the wafers 200) in the spare chamber 201a. Then, the gas is ejected into the inner tube 204 through the gas supply holes 410a of the nozzle 410, the gas supply holes 420a of the nozzle 420, the gas supply holes 430a of the nozzle 430, the gas supply holes 440a of the nozzle 440 and the gas supply holes 450a of the nozzle 450 provided at the positions facing the wafers 200. More specifically, the gas such as the source gas and the reactive gas is ejected into the inner tube 204 in a direction parallel to surfaces of the wafers 200 through the gas supply holes 410a of the nozzle 410, the gas supply holes 420a of the nozzle 420, the gas supply holes 430a of the nozzle 430, the gas supply holes 440a of the nozzle 440 and the gas supply holes 450a of the nozzle 450.

An exhaust hole (exhaust port) 204a is a through-hole facing the nozzles 410, 420, 430, 440 and 450, and is provided at a side wall of the inner tube 204. For example, the exhaust hole 204a may be of a narrow slit-shaped through-hole elongating vertically. The gas supplied into the process chamber 201 through the gas supply holes 410a of the nozzle 410, the gas supply holes 420a of the nozzle 420, the gas supply holes 430a of the nozzle 430, the gas supply holes 440a of the nozzle 440 and the gas supply holes 450a of the nozzle 450 flows over the surfaces of the wafers 200. Then, the gas that has flowed over the surfaces of the wafers 200 is exhausted through the exhaust hole 204a into an exhaust path 206 constituted by a gap provided between the inner tube 204 and the outer tube 203. Then, the gas flowing in the exhaust path 206 flows into an exhaust pipe 231 and is then discharged (exhausted) out of the process furnace 202.

The exhaust hole 204a is provided at a location facing the wafers 200. The gas supplied into the vicinity of the wafers 200 in the process chamber 201 through the gas supply holes 410a of the nozzle 410, the gas supply holes 420a of the nozzle 420, the gas supply holes 430a of the nozzle 430, the gas supply holes 440a of the nozzle 440 and the gas supply holes 450a of the nozzle 450 flows in a horizontal direction. The gas that has flowed in the horizontal direction is exhausted through the exhaust hole 204a into the exhaust path 206. The exhaust hole 204a is not limited to the slit-shaped through-hole. For example, the exhaust hole 204a may be configured as a plurality of holes.

The exhaust pipe 231 through which an inner atmosphere of the process chamber 201 is exhausted is installed at the manifold 209. A pressure sensor 245 serving as a pressure detector (pressure detecting structure) configured to detect an inner pressure of the process chamber 201, an APC (Automatic Pressure Controller) valve 243 and a vacuum pump 246 serving as a vacuum exhaust apparatus are sequentially connected to the exhaust pipe 231 in this order from an upstream side to a downstream side of the exhaust pipe 231. With the vacuum pump 246 in operation, the APC valve 243 may be opened or closed to perform a vacuum exhaust of the process chamber 201 or stop the vacuum exhaust. In addition, with the vacuum pump 246 in operation, an opening degree of the APC valve 243 may be adjusted in order to adjust the inner pressure of the process chamber 201. An exhauster (also referred to as an exhaust structure or an exhaust system) is constituted mainly by the exhaust hole 204a, the exhaust path 206, the exhaust pipe 231, the APC valve 243 and the pressure sensor 245. The exhauster may further include the vacuum pump 246.

A seal cap 219 serving as a furnace opening lid capable of airtightly sealing a lower end opening of the manifold 209 is provided under the manifold 209. The seal cap 219 is in contact with the lower end of the manifold 209 from vertically thereunder. For example, the seal cap 219 is made of a metal such as SUS, and is of a disk shape. An O-ring 220b serving as a seal is provided on an upper surface of the seal cap 219 so as to be in contact with the lower end of the manifold 209. A rotator 267 configured to rotate the boat 217 accommodating the wafers 200 is provided at the seal cap 219 opposite to the process chamber 201. A rotating shaft 255 of the rotator 267 is connected to the boat 217 through the seal cap 219. As the rotator 267 rotates the boat 217, the wafers 200 accommodated in the boat 217 are rotated. The seal cap 219 may be elevated or lowered in the vertical direction by a boat elevator 115 serving as an elevating structure vertically provided outside the outer tube 203. When the seal cap 219 is elevated or lowered in the vertical direction by the boat elevator 115, the boat 217 may be transferred (loaded) into the process chamber 201 or transferred (unloaded) out of the process chamber 201. The boat elevator 115 serves as a transfer device (which is a transfer structure or a transfer system) that loads the boat 217 and the wafers 200 accommodated in the boat 217 into the process chamber 201 or unloads the boat 217 and the wafers 200 accommodated in the boat 217 out of the process chamber 201.

The boat 217 serving as a substrate retainer is configured to accommodate (support) the wafers 200 (for example, 25 wafers to 200 wafers) while the wafers 200 are horizontally oriented with their centers aligned with each other with a predetermined interval therebetween in the vertical direction. For example, the boat 217 is made of a heat resistant material such as quartz and SiC. A plurality of heat insulating plates including a heat insulating plate 218 horizontally oriented are provided under the boat 217 in a multistage manner (not shown). The heat insulating plate 218 is made of a heat resistant material such as quartz and SiC. With such a configuration, the heat insulating plate 218 suppresses the transmission of the heat from the heater 207 to the seal cap 219. However, the present embodiments are not limited thereto. For example, instead of the heat insulating plate 218, a heat insulating cylinder (not shown) such as a cylinder made of a heat resistant material such as quartz and SiC may be provided under the boat 217.

Figure 2:
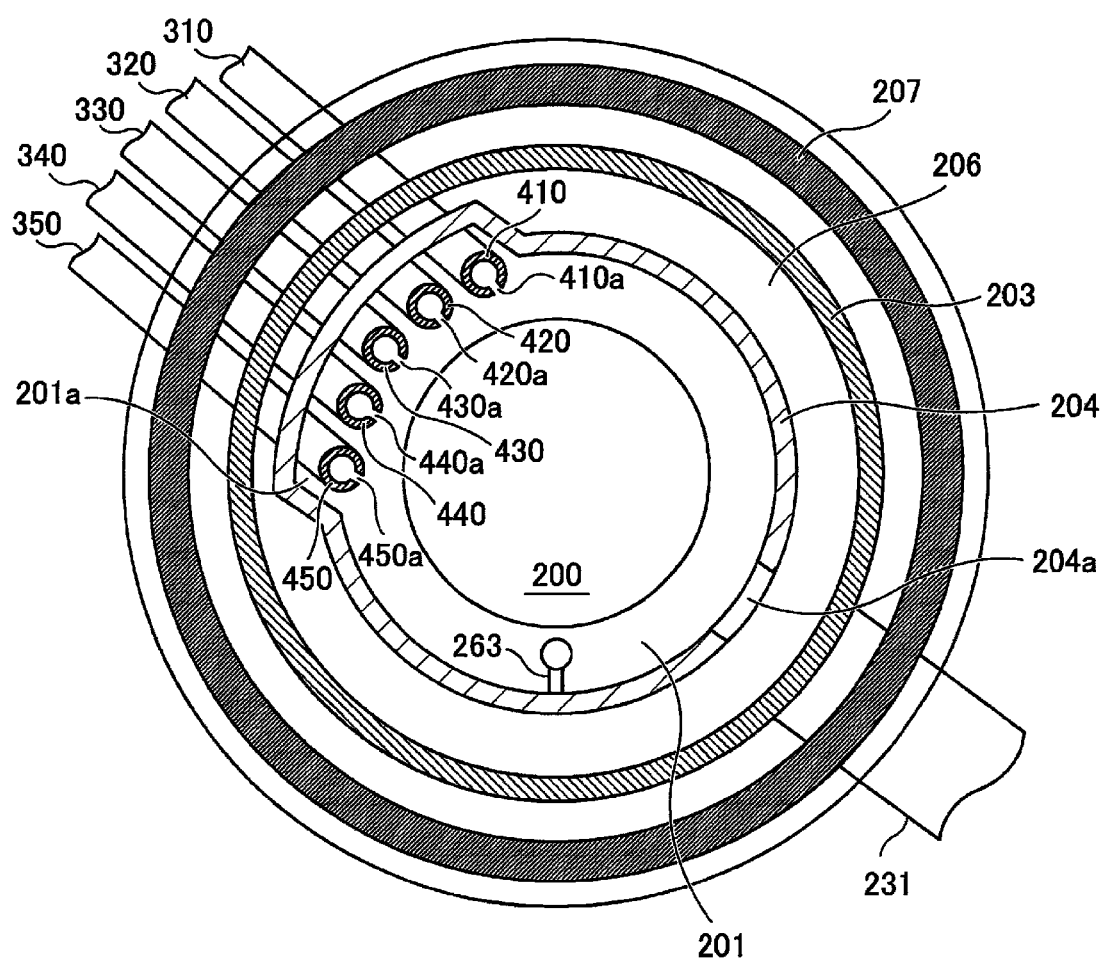
FIG. 2 is a diagram schematically illustrating a horizontal cross-section, taken along the line A-A shown in FIG. 1, of the vertical type process furnace of the substrate processing apparatus according to the embodiments of the present disclosure.

As shown in FIG. 2, a temperature sensor 263 serving as a temperature detector is installed in the inner tube 204. An amount of the current supplied to the heater 207 is adjusted based on temperature information detected by the temperature sensor 263 such that a desired temperature distribution of an inner temperature of the process chamber 201 can be obtained. Similar to the nozzles 410, 420, 430, 440 and 450, the temperature sensor 263 is L-shaped, and is provided along the inner wall of the inner tube 204.

Figure 3:
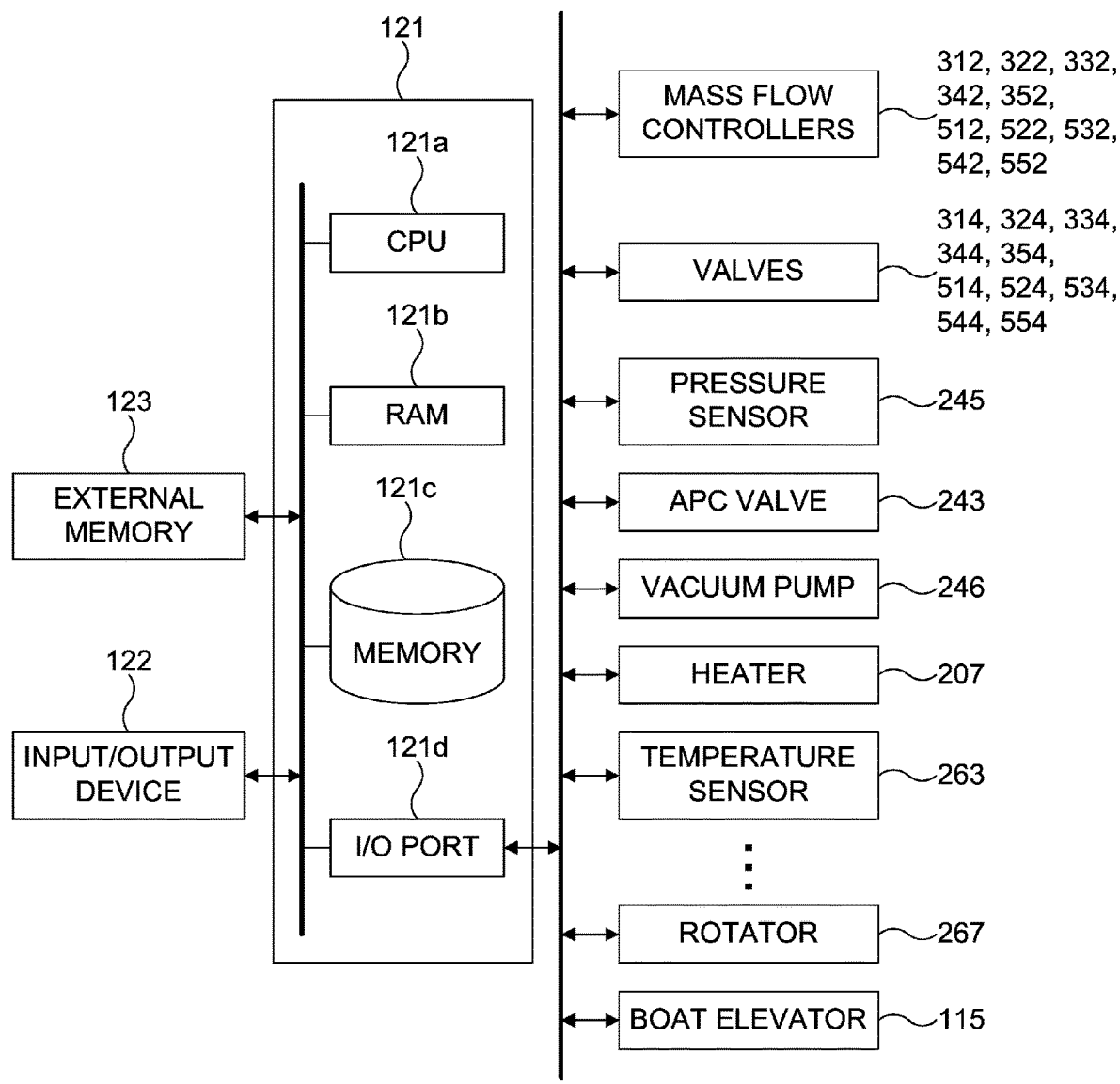
FIG. 3 is a block diagram schematically illustrating a configuration of a controller and related components of the substrate processing apparatus according to the embodiments of the present disclosure.

As shown in FIG. 3, a controller 121 serving as a control device (control structure) is constituted by a computer including a CPU (Central Processing Unit) 121a, a RAM (Random Access Memory) 121b, a memory 121c and an I/O port 121d. The RAM 121b, the memory 121c and the I/O port 121d may exchange data with the CPU 121a through an internal bus. For example, an input/output device 122 such as a touch panel is connected to the controller 121.

The memory 121c is configured by a component such as a flash memory and a hard disk drive (HDD). For example, a control program configured to control the operation of the substrate processing apparatus 10 or a process recipe containing information on sequences and conditions of a method of manufacturing a semiconductor device described later is readably stored in the memory 121c. The process recipe is obtained by combining steps (processes) of the method of manufacturing the semiconductor device described later such that the controller 121 can execute the steps to acquire a predetermined result, and functions as a program. Hereafter, the process recipe and the control program may be collectively or individually referred to as a "program". In the present specification, the term "program" may refer to the process recipe alone, may refer to the control program alone, or may refer to a combination of the process recipe and the control program. The RAM 121b functions as a memory area (work area) where a program or data read by the CPU 121a is temporarily stored.

The I/O port 121d is connected to the above-described components such as the MFCs 312, 322, 332, 342, 352, 512, 522, 532, 542 and 552, the valves 314, 324, 334, 344, 354, 514, 524, 534, 544 and 554, the pressure sensor 245, the APC valve 243, the vacuum pump 246, the heater 207, the temperature sensor 263, the rotator 267 and the boat elevator 115.

The CPU 121a is configured to read the control program from the memory 121c and execute the read control program. In addition, the CPU 121a is configured to read a recipe such as the process recipe from the memory 121c in accordance with an operation command inputted from the input/output device 122. According to the contents of the read recipe, the CPU 121a may be configured to be capable of controlling various operations such as flow rate adjusting operations for various gases by the MFCs 312, 322, 332, 342, 352, 512, 522, 532, 542 and 552, opening and closing operations of the valves 314, 324, 334, 344, 354, 514, 524, 534, 544 and 554, an opening and closing operation of the APC valve 243, a pressure adjusting operation by the APC valve 243 based on the pressure sensor 245, a temperature adjusting operation by the heater 207 based on the temperature sensor 263, a start and stop of the vacuum pump 246, an operation of adjusting the rotation and the rotation speed of the boat 217 by the rotator 267, an elevating and lowering operation of the boat 217 by the boat elevator 115 and an operation of transferring and accommodating the wafer 200 into the boat 217.

The controller 121 may be embodied by installing the above-described program stored in an external memory 123 into a computer. For example, the external memory 123 may include a magnetic tape, a magnetic disk such as a flexible disk and a hard disk, an optical disk such as a CD and a DVD, a magneto-optical disk such as an MO and a semiconductor memory such as a USB memory and a memory card. The memory 121c or the external memory 123 may be embodied by a non-transitory computer readable recording medium. Hereafter, the memory 121c and the external memory 123 are collectively or individually referred to as a "recording medium". In the present specification, the term "recording medium" may refer to the memory 121c alone, may refer to the external memory 123 alone, and may refer to both of the memory 121c and the external memory 123. Instead of the external memory 123, a communication means such as the Internet and a dedicated line may be used for providing the program to the computer.

(2) Substrate Processing (Film-Forming Process)

Hereinafter, as a part of a manufacturing process of the semiconductor device, an example of a substrate processing of forming a titanium nitride film (also simply referred to as a "TiN film") on the wafers 200 will be described with reference to FIG. 4. The substrate processing of forming the TiN film is performed using the process furnace 202 of the substrate processing apparatus 10 described above. In the following description, the operations of the components constituting the substrate processing apparatus 10 are controlled by the controller 121.

First Embodiment

A first embodiment will be described with reference to FIG. 4. In the substrate processing (the manufacturing process of the semiconductor device) according to the present embodiment, a multi-layer film structure including a plurality of TiN films is formed on the wafers 200 by alternately performing:
(a) a step of forming the TiN film serving as a metal-containing film on the wafer 200; and
(b) a step of supplying the process gas to the wafer 200 so as to perform one or both of (b-1) a crystal layer separation film forming step of forming the crystal layer separation film to a surface of the TiN film and (b-2) an abnormal growth nuclei removing step of removing the abnormal growth nuclei at the surface of the TiN film.

In addition, a cycle comprising (a) and (b) may be repeatedly performed. In the crystal layer separation film forming step, the $O_2$ gas serving as the oxygen-containing gas is supplied as the process gas. A pressure when supplying the $O_2$ gas may be set to be different for each execution of the cycle, or the $SiH_4$ gas serving as the silicon-containing gas may be supplied.

In addition, in the abnormal growth nuclei removing step, the $WF_6$ gas serving as the halogen-containing gas and also serving the gas containing the metal element may be supplied as the process gas.

When the TiN film is formed, the abnormal growth nuclei may grow with a crystal growth of the TiN film. According to the present embodiment, it is possible to stop the crystal growth of the TiN film by forming the crystal layer separation film on the surface of the TiN film each time the TiN film of a predetermined thickness is formed. As a result, it is possible to stop a growth of the abnormal growth nuclei. Thereby, the surface of the TiN film is flattened. In addition, by removing (etching) the abnormal growth nuclei formed on the surface of the TiN film each time the TiN film of the predetermined thickness is formed, the surface of the TiN film is flattened. When the abnormal growth nuclei is removed, the surface of the TiN film is also etched. The "crystal growth of the TiN film" may also refer to a growth of TiN crystal grains. When the TiN film is formed, a plurality of crystals (crystal grains) may usually grow. The abnormal growth nuclei may be formed in the plurality of crystals.

In the present specification, the term "wafer" may refer to "a wafer itself", or may refer to "a wafer and a stacked structure (aggregated structure) of a predetermined layer (or layers) or a film (or films) formed on a surface of the wafer". In the present specification, the term "a surface of a wafer" may refer to "a surface of a wafer itself", or may refer to "a surface of a predetermined layer or a film formed on a wafer". In the present specification, the terms "substrate" and "wafer" may be used as substantially the same meaning. That is, the term "substrate" may be substituted by "wafer" and vice versa.

<Wafer Loading Step>

The wafers 200 are charged (transferred) into the boat 217 (wafer charging step). After the boat 217 is charged with the wafers 200, as shown in FIG. 1, the boat 217 charged with the wafers 200 is elevated by the boat elevator 115 and loaded (transferred) into the process chamber 201 (boat loading step). With the boat 217 loaded, the seal cap 219 seals a lower end opening of the outer tube 203 (that is, the lower end opening of the manifold 209) via the O-ring 220b.

<Pressure Adjusting Step and Temperature Adjusting Step>

The vacuum pump 246 vacuum-exhausts the inner atmosphere of the process chamber 201 until the inner pressure of the process chamber 201 (that is, a space in which the wafers 200 are accommodated) reaches and is maintained at a desired pressure (vacuum degree). When the vacuum pump 246 vacuum-exhausts the inner atmosphere of the process chamber 201, the inner pressure of the process chamber 201 is measured by the pressure sensor 245, and the APC valve 243 is feedback-controlled based on pressure information measured by the pressure sensor 245 (pressure adjusting step). The vacuum pump 246 continuously vacuum-exhausts the inner atmosphere of the process chamber 201 until at least a processing (that is, the substrate processing) of the wafer 200 is completed. In addition, the heater 207 heats the process chamber 201 until the inner temperature of the process chamber 201 reaches and is maintained at a desired temperature. When the heater 207 heats the process chamber 201, the amount of the current supplied to the heater 207 is feedback-controlled based on the temperature information detected by the temperature sensor 263 such that the desired temperature distribution of the inner temperature of the process chamber 201 is obtained (temperature adjusting step). The heater 207 continuously heats the process chamber 201 until at least the processing of the wafer 200 is completed.

<Film-Forming Step>

A film-forming step is performed by performing a cycle including a first step, a second step, a third step and a fourth step described below a predetermined number of times (n times).

<$TiCl_4$ Gas Supply Step, First Step>

The valve 314 is opened to supply the $TiCl_4$ gas serving as the source gas into the gas supply pipe 310. A flow rate of the $TiCl_4$ gas supplied into the gas supply pipe 310 is adjusted by the MFC 312. The $TiCl_4$ gas whose flow rate is adjusted is then supplied into the process chamber 201 through the gas supply holes 410a of the nozzle 410, and is exhausted through the exhaust pipe 231. Thereby, the $TiCl_4$ gas is supplied to the wafers 200. When the $TiCl_4$ gas is supplied, simultaneously, the valve 514 may be opened to supply the inert gas such as the $N_2$ gas into the gas supply pipe 510. A flow rate of the $N_2$ gas supplied into the gas supply pipe 510 is adjusted by the MFC 512. The $N_2$ gas whose flow rate is adjusted is then supplied into the process chamber 201 together with the TiCl$_4$ gas, and is exhausted through the exhaust pipe 231. In the first step, in order to prevent the TiCl$_4$ gas from entering the nozzles 420, 430, 440 and 450, the valves 524, 534, 544 and 554 may be opened to supply the N$_2$ gas into the gas supply pipes 520, 530, 540 and 550. The N$_2$ gas is then supplied into the process chamber 201 through the gas supply pipes 320, 330, 340 and 350 and the nozzles 420, 430, 440 and 450, and is exhausted through the exhaust pipe 231.

In the first step, for example, the APC valve 243 is appropriately controlled to adjust the inner pressure of the process chamber 201 to a pressure within a range from 1 Pa to 3,990 Pa. For example, a supply flow rate of the TiCl$_4$ gas controlled by the MFC 312 may be set to a flow rate within a range from 0.1 slm to 2.0 slm. For example, supply flow rates of the N$_2$ gas controlled by the MFCs 512, 522, 532, 542 and 552 may be set to flow rates within a range from 0.1 slm to 20 slm, respectively. In the first step, for example, a temperature of the heater 207 may be set such that a temperature of the wafer 200 reaches and is maintained at a temperature within a range from 300° C. to 500° C.

In the first step, the TiCl$_4$ gas and the N$_2$ gas are supplied into the process chamber 201 without any other gas being supplied into the process chamber 201 together with the TiCl$_4$ gas and the N$_2$ gas. By supplying the TiCl$_4$ gas, a titanium-containing layer is formed on the wafer 200 (that is, on a base film on the surface of the wafer 200). The titanium-containing layer may refer to a titanium layer containing chlorine (Cl), may refer to an adsorption layer of the TiCl$_4$ gas, or may refer to both of the titanium layer containing chlorine and the adsorption layer of the TiCl$_4$ gas.

<Residual Gas Removing Step, Second Step>

After a predetermined time (for example, from 0.01 second to 10 seconds) has elapsed from a supply of the TiCl$_4$ gas, the valve 314 is closed to stop the supply of the TiCl$_4$ gas. In the second step, with the APC valve 243 of the exhaust pipe 231 open, the vacuum pump 246 vacuum-exhausts the inner atmosphere of the process chamber 201 to remove a residual gas in the process chamber 201 such as the TiCl$_4$ gas remaining in the process chamber 201 which did not react or which contributed to the formation of the titanium-containing layer out of the process chamber 201. In the second step, with the valves 514, 524, 534, 544 and 554 open, the N$_2$ gas is continuously supplied into the process chamber 201. The N$_2$ gas serves as a purge gas, which improves the efficiency of removing the TiCl$_4$ gas remaining in the process chamber 201 which did not react or which contributed to the formation of the titanium-containing layer out of the process chamber 201.

<NH$_3$ Gas Supply Step, Third Step>

After the residual gas in the process chamber 201 is removed, the valve 334 is opened to supply the NH$_3$ gas serving as the reactive gas into the gas supply pipe 330. A flow rate of the NH$_3$ gas supplied into the gas supply pipe 330 is adjusted by the MFC 332. The NH$_3$ gas whose flow rate is adjusted is then supplied into the process chamber 201 through the gas supply holes 430a of the nozzle 430, and is exhausted through the exhaust pipe 231. Thereby, the NH$_3$ gas is supplied to the wafers 200. When the NH$_3$ gas is supplied, simultaneously, the valve 534 may be opened to supply the inert gas such as the N$_2$ gas into the gas supply pipe 530. A flow rate of the N$_2$ gas supplied into the gas supply pipe 530 is adjusted by the MFC 532. The N$_2$ gas whose flow rate is adjusted is then supplied into the process chamber 201 together with the NH$_3$ gas, and is exhausted through the exhaust pipe 231. In the third step, in order to prevent the NH$_3$ gas from entering the nozzles 410, 420, 440 and 450, the valves 514, 524, 544 and 554 may be opened to supply the N$_2$ gas into the gas supply pipes 510, 520, 540 and 550. The N$_2$ gas is then supplied into the process chamber 201 through the gas supply pipes 310, 320, 340 and 350 and the nozzles 410, 420, 440 and 450, and is exhausted through the exhaust pipe 231.

In the third step, for example, the APC valve 243 is appropriately controlled to adjust the inner pressure of the process chamber 201 to a pressure within a range from 1 Pa to 3,990 Pa. For example, a supply flow rate of the NH$_3$ gas controlled by the MFC 332 may be set to a flow rate within a range from 0.1 slm to 30.0 slm. For example, the supply flow rates of the N$_2$ gas controlled by the MFCs 512, 522, 532, 542 and 552 may be set to flow rates within a range from 0.1 slm to 30 slm, respectively. For example, a supply time (time duration) of supplying the NH$_3$ gas to the wafer 200 may be set to a time within a range from 0.01 second to 30 seconds. In the third step, for example, the temperature of the heater 207 may be set to substantially the same temperature as in the TiCl$_4$ gas supply step.

In the third step, the NH$_3$ gas and the N$_2$ gas are supplied into the process chamber 201 without any other gas being supplied into the process chamber 201 together with the NH$_3$ gas and the N$_2$ gas. A substitution reaction occurs between the NH$_3$ gas and at least a portion of the titanium-containing layer formed on the wafer 200 in the first step. During the substitution reaction, titanium (Ti) contained in the titanium-containing layer and nitrogen (N) contained in the NH$_3$ gas are bonded together. As a result, a TiN layer is formed on the wafer 200.

<Residual Gas Removing Step, Fourth Step>

After the TiN layer is formed, the valve 334 is closed to stop a supply of the NH$_3$ gas. Then, a residual gas in the process chamber 201 such as the NH$_3$ gas remaining in the process chamber 201 which did not react or which contributed to the formation of the TiN layer and reaction byproducts are removed out of the process chamber 201 in substantially the same manners as in the residual gas removing step (that is, the second step) described above.

<Performing a Predetermined Number of Times>

By performing the cycle wherein the first step, the second step, the third step and the fourth step described above are sequentially performed in this order the predetermined number of times (n times), the TiN film of a predetermined thickness (for example, 100 Å) is formed on the wafer 200.

<Crystal Layer Separation Film Forming Step>

As the crystal layer separation film forming step according to the first embodiment, an O$_2$ gas supply step is performed.

<O$_2$ Gas Supply Step, Fifth Step of First Embodiment>

After the TiN film of the predetermined thickness is formed, the valve 344 is opened to supply the O$_2$ gas serving as the oxygen-containing gas into the gas supply pipe 340. A flow rate of the O$_2$ gas supplied into the gas supply pipe 340 is adjusted by the MFC 342. The O$_2$ gas whose flow rate is adjusted is then supplied into the process chamber 201 through the gas supply holes 440a of the nozzle 440, and is exhausted through the exhaust pipe 231. Thereby, the O$_2$ gas is supplied to the wafers 200. When the O$_2$ gas is supplied, simultaneously, the valve 544 may be opened to supply the inert gas such as the N$_2$ gas into the gas supply pipe 540. A flow rate of the N$_2$ gas supplied into the gas supply pipe 540 is adjusted by the MFC 542. The N$_2$ gas whose flow rate is adjusted is then supplied into the process chamber 201 together with the O$_2$ gas, and is exhausted through the exhaust pipe 231. In the fifth step of the first embodiment, the valves 514, 524, 534 and 554 are closed to stop the supply of the N₂ gas through the nozzles 410, 420, 430 and 450.

In the fifth step of the first embodiment, for example, the APC valve 243 is appropriately controlled to adjust the inner pressure of the process chamber 201 to a pressure within a range from 0.1 Pa to 3,990 Pa, and the inner pressure of the process chamber 201 is adjusted differently each time the fifth step of the first embodiment is performed. In addition, for example, a supply flow rate of the O₂ gas controlled by the MFC 342 may be set to a flow rate within a range from 0.1 slm to 10 slm. For example, a supply flow rate of the N₂ gas controlled by the MFC 542 may be set to a flow rate within a range from 0.1 slm to 20 slm. In the fifth step of the first embodiment, for example, the temperature of the heater 207 may be set such that the temperature of the wafer 200 is constantly maintained at substantially the same temperature as a film-forming temperature (which is the temperature of the wafer 200 in the film-forming step), for example, a temperature within a range from 300° C. to 500° C. However, the temperature of the wafer 200 in the fifth step of the first embodiment may be set to be different from the film-forming temperature.

In the fifth step of the first embodiment, the O₂ gas and the N₂ gas are supplied into the process chamber 201 without any other gas being supplied into the process chamber 201 together with the O₂ gas and the N₂ gas. By supplying the O₂ gas, the TiN film on the wafer 200 (that is, on the base film on the surface of the wafer 200) is oxidized, and oxygen atoms are diffused in the TiN film so as to change a crystallinity of the TiN film. As a result, a titanium oxynitride film (also referred to as a "TiNO film") or a titanium oxide film (also referred to as a "TiO film") serving as a crystal layer separation film is formed on the surface of the TiN film, and the surface of the TiN film is flattened.

In addition, the pressure (that is, the inner pressure of the process chamber 201) in the fifth step of the first embodiment may be adjusted to a pressure closer to the atmospheric pressure rather than the pressure described above. By adjusting the pressure closer to the atmospheric pressure, it is possible to improve a contact probability between molecules of the O₂ gas and the film to be processed (in the present embodiment, the TiN film), and it is also possible to improve an oxygen adsorption rate on the surface of the film to be processed. That is, it is possible to improve a uniformity of an oxidation process.

<Purge Step>
<Residual Gas Removing Step, Sixth Step>

After a predetermined time has elapsed from a supply of the O₂ gas, the valve 344 is closed to stop the supply of the O₂ gas. In the sixth step, with the APC valve 243 of the exhaust pipe 231 open, the vacuum pump 246 vacuum-exhausts the inner atmosphere of the process chamber 201 to remove a residual gas in the process chamber 201 such as the O₂ gas remaining in the process chamber 201 which did not react or which contributed to the formation of the TiNO film or the TiO film out of the process chamber 201. In the sixth step, with the valve 544 open, the valves 514, 524, 534 and 554 are opened to supply the N₂ gas into the process chamber 201. The N₂ gas serves as the purge gas, which improves the efficiency of removing the O₂ gas remaining in the process chamber 201 which did not react or which contributed to the formation of the TiNO film or the TiO film out of the process chamber 201.

<Performing a Predetermined Number of Times>

By performing a cycle wherein (a) the predetermined number of executions (n times) of the film-forming step, (b) the crystal layer separation film forming step by supplying the O₂ gas and (c) the purge step (that is, the sixth step) described above are sequentially performed in this order at least once (a predetermined number of times: m times), a multi-layer TiN film structure of a predetermined thickness (for example, 250 Å) constituted by the plurality of TiN films (each of which has the predetermined thickness, for example, 100 Å) separated by the TiNO film or the TiO film serving as the crystal layer separation film can be formed on the wafer 200.

As described above, the pressure when the O₂ gas is supplied in the crystal layer separation film forming step (that is, the fifth step of the first embodiment) is controlled to be different for each execution of the cycle. Specifically, the pressure when the O₂ gas is supplied in the crystal layer separation film forming step described above is controlled to increase as the number of executions of the cycle increases (that is, the pressure during a later execution of the cycle is controlled to be higher than the pressure during an earlier execution of the cycle). Further, the pressure when the O₂ gas is supplied in the crystal layer separation film forming step described above is set to be smaller than a pressure during a final supply of the O₂ gas after, for example, a thickness of the TiN film reaches 250 Å in a case where a target thickness of the TiN film is 250 Å. As the inner pressure of the process chamber 201 becomes higher, the surface of the TiN film is more likely to be oxidized. Therefore, the surface of the TiN film is reoxidized by setting the pressure to be smaller than the pressure during the final supply of the O₂ gas (which is, for example, close to the atmospheric pressure) while controlling the pressure to increase as the number of the executions of the cycle increases.

<After-Purge Step and Returning to Atmospheric Pressure Step>

The N₂ gas is supplied into the process chamber 201 through each of the gas supply pipes 510, 520, 530, 540 and 550, and is exhausted through the exhaust pipe 231. The N₂ gas serves as the purge gas, and the inner atmosphere of the process chamber 201 is purged with the inert gas. Thereby, the residual gas in the process chamber 201 and by-products remaining in the process chamber 201 are removed from the process chamber 201 (after-purge step). Thereafter, the inner atmosphere of the process chamber 201 is replaced with the inert gas (substitution by the inert gas), and the inner pressure of the process chamber 201 is returned to the normal pressure (atmospheric pressure) (returning to atmospheric pressure step).

<Wafer Unloading Step>

Thereafter, the seal cap 219 is lowered by the boat elevator 115 and the lower end of the outer tube 203 is opened. Then, the boat 217 with the processed wafers 200 charged therein is unloaded out of the inner tube 204 through the lower end of the inner tube 204 (boat unloading step). Then, the processed wafers 200 are transferred (discharged) from the boat 217 (wafer discharging step).

That is, according to the present embodiment, each time the TiN film of a predetermined thickness (for example, 100 Å) is formed on the wafer 200, the crystal layer separation film is formed on the surface of the TiN film. Thereby, the surface of the TiN film is oxidized so as to change the crystallinity of the TiN film, and the crystal growth of the TiN film can be suppressed. As a result, it is possible to suppress the formation of the abnormal growth nuclei, and it is also possible to form a flattened TiN film of a predetermined thickness (for example, 250 Å). That is, it is possible to reduce a resistance of the W film formed on the surface of the TiN film.

(3) Effects According to Present Embodiment

According to the present embodiment described above, it is possible to obtain at least one among the following effects.
(a) By suppressing the formation of the abnormal growth nuclei, it is possible to form a sufficiently flat TiN film.
(b) It is possible to reduce the resistance of the W film formed on the TiN film.

(4) Other Embodiments

Subsequently, other embodiments of the embodiment described above will be described in detail. In the following embodiments, detailed description will be given only on their features different from those of the embodiment described above.

Second Embodiment

Figure 5:
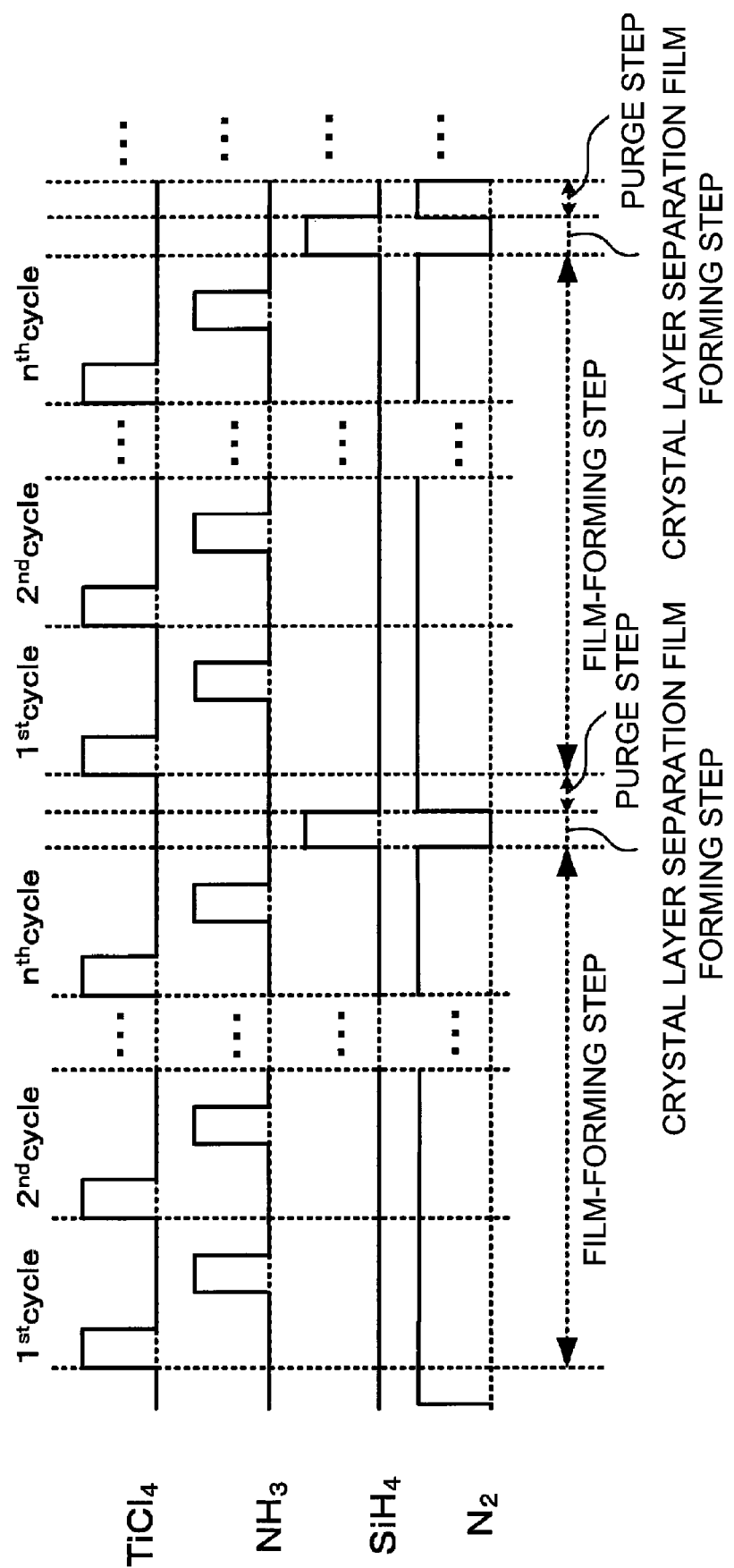
FIG. 5 is a diagram schematically illustrating a film-forming sequence according to a second embodiment of the present disclosure.

FIG. 5 is a diagram schematically illustrating a film-forming sequence according to a second embodiment. The crystal layer separation film forming step of the present embodiment is different from that of the embodiment described above. Specifically, using the substrate processing apparatus 10 described above, the $SiH_4$ gas serving as the silicon-containing gas is supplied in the crystal layer separation film forming step of the present embodiment instead of the $O_2$ gas supply in the crystal layer separation film forming step of the embodiment described above.

<Crystal Layer Separation Film Forming Step>

As the crystal layer separation film forming step according to the second embodiment, a $SiH_4$ gas supply step is performed.

<$SiH_4$ Gas Supply Step, Fifth Step of Second Embodiment>

After the TiN film of the predetermined thickness is formed, the valve 324 is opened to supply the $SiH_4$ gas serving as the silicon-containing gas into the gas supply pipe 320. A flow rate of the $SiH_4$ gas supplied into the gas supply pipe 320 is adjusted by the MFC 322. The $SiH_4$ gas whose flow rate is adjusted is then supplied into the process chamber 201 through the gas supply holes 420a of the nozzle 420, and is exhausted through the exhaust pipe 231. Thereby, the $SiH_4$ gas is supplied to the wafers 200. When the $SiH_4$ gas is supplied, simultaneously, the valve 524 may be opened to supply the inert gas such as the $N_2$ gas into the gas supply pipe 520. A flow rate of the $N_2$ gas supplied into the gas supply pipe 520 is adjusted by the MFC 522. The $N_2$ gas whose flow rate is adjusted is then supplied into the process chamber 201 together with the $SiH_4$ gas, and is exhausted through the exhaust pipe 231. In the fifth step of the first embodiment, the valves 514, 534, 544 and 554 are closed to stop the supply of the $N_2$ gas through the nozzles 410, 430, 440 and 450.

In the fifth step of the second embodiment, for example, the APC valve 243 is appropriately controlled to adjust the inner pressure of the process chamber 201 to a pressure within a range from 0.1 Pa to 3,990 Pa. In addition, for example, a supply flow rate of the $SiH_4$ gas controlled by the MFC 322 may be set to a flow rate within a range from 0.1 slm to 10 slm. For example, a supply flow rate of the $N_2$ gas controlled by the MFC 522 may be set to a flow rate within a range from 0.1 slm to 20 slm. In the fifth step of the second embodiment, for example, the temperature of the heater 207 may be set such that the temperature of the wafer 200 is constantly maintained at substantially the same temperature as the film-forming temperature (which is the temperature of the wafer 200 in the film-forming step), for example, a temperature within a range from 300° C. to 500° C. However, the temperature of the wafer 200 in the fifth step of the second embodiment may be set to be different from the film-forming temperature.

In the fifth step of the second embodiment, the $SiH_4$ gas and the $N_2$ gas are supplied into the process chamber 201 without any other gas being supplied into the process chamber 201 together with the $SiH_4$ gas and the $N_2$ gas. By supplying the $SiH_4$ gas, a titanium silicon nitride film (also referred to as a "TiSiN film") serving as the crystal layer separation film is formed on the surface of the TiN film, and the surface of the TiN film is flattened.

<Purge Step>
<Residual Gas Removing Step, Sixth Step>

After a predetermined time has elapsed from a supply of the $SiH_4$ gas, the valve 324 is closed to stop the supply of the $SiH_4$ gas. In the sixth step, with the APC valve 243 of the exhaust pipe 231 open, the vacuum pump 246 vacuum-exhausts the inner atmosphere of the process chamber 201 to remove a residual gas in the process chamber 201 such as the $SiH_4$ gas remaining in the process chamber 201 which did not react or which contributed to the formation of the TiSiN film out of the process chamber 201. In the sixth step, with the valve 524 open, the valves 514, 534, 544 and 554 are opened to supply the $N_2$ gas into the process chamber 201. The $N_2$ gas serves as the purge gas, which improves the efficiency of removing the $SiH_4$ gas remaining in the process chamber 201 which did not react or which contributed to the formation of the TiSiN film out of the process chamber 201.

<Performing a Predetermined Number of Times>

By performing a cycle wherein (a) the predetermined number of executions (n times) of the film-forming step, (b) the crystal layer separation film forming step by supplying the $SiH_4$ gas and (c) the purge step (that is, the sixth step) described above are sequentially performed in this order at least once (a predetermined number of times: m times), a multi-layer TiN film structure of a predetermined thickness (for example, 250 Å) constituted by the plurality of TiN films (each of which has the predetermined thickness of, for example, 100 Å) separated by the TiSiN film serving as the crystal layer separation film can be formed on the wafer 200.

That is, according to the present embodiment, each time the TiN film of a predetermined thickness (for example, 100 Å) is formed on the wafer 200, the crystal layer separation film is formed on the surface of the TiN film. Thereby, the crystals on the surface of the TiN film can be separated from one another, and the crystal growth of the TiN film can be suppressed. As a result, it is possible to suppress the formation of the abnormal growth nuclei, and it is also possible to form a flattened TiN film of a predetermined thickness (for example, 250 Å). That is, it is possible to reduce the resistance of the W film formed on the surface of the TiN film.

Third Embodiment

Figure 6:
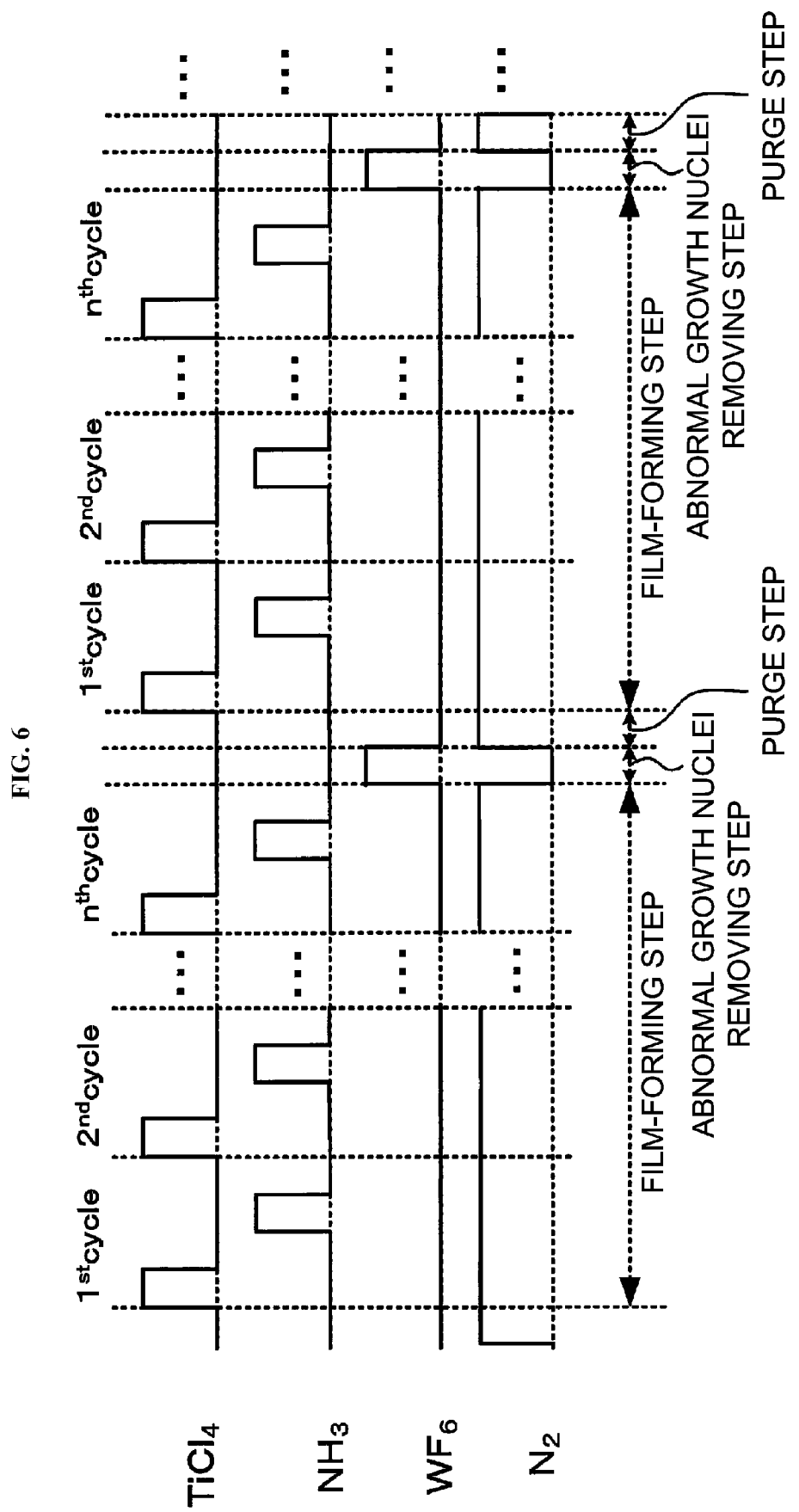
FIG. 6 is a diagram schematically illustrating a film-forming sequence according to a third embodiment of the present disclosure.

FIG. 6 is a diagram schematically illustrating a film-forming sequence according to a third embodiment. According to the present embodiment, the $WF_6$ gas serving as the halogen-containing gas and also serving as the gas containing the metal element is supplied in the abnormal growth nuclei removing step of the present embodiment instead of the $O_2$ gas or the $SiH_4$ gas in the crystal layer separation film forming step of the embodiment described above.

<Abnormal Growth Nuclei Removing Step>

As the abnormal growth nuclei removing step according to the second embodiment, a $WF_6$ gas supply step is performed.

<$WF_6$ Gas Supply Step, Fifth Step of Third Embodiment>

After the TiN film of the predetermined thickness is formed, the valve 354 is opened to supply the $WF_6$ gas serving as the halogen-containing gas into the gas supply pipe 350. A flow rate of the $WF_6$ gas supplied into the gas supply pipe 350 is adjusted by the MFC 352. The $WF_6$ gas whose flow rate is adjusted is then supplied into the process chamber 201 through the gas supply holes 450a of the nozzle 450, and is exhausted through the exhaust pipe 231. Thereby, the $WF_6$ gas is supplied to the wafers 200. When the $WF_6$ gas is supplied, simultaneously, the valve 554 may be opened to supply the inert gas such as the $N_2$ gas into the gas supply pipe 550. A flow rate of the $N_2$ gas supplied into the gas supply pipe 550 is adjusted by the MFC 552. The N2 gas whose flow rate is adjusted is then supplied into the process chamber 201 together with the $WF_6$ gas, and is exhausted through the exhaust pipe 231. In the fifth step of the third embodiment, the valves 514, 524, 534 and 544 are closed to stop the supply of the $N_2$ gas through the nozzles 410, 420, 430 and 440.

In the fifth step of the third embodiment, for example, the APC valve 243 is appropriately controlled to adjust the inner pressure of the process chamber 201 to a pressure within a range from 0.1 Pa to 6,650 Pa. In addition, for example, a supply flow rate of the $WF_6$ gas controlled by the MFC 352 may be set to a flow rate within a range from 0.01 slm to 10 slm. For example, a supply flow rate of the $N_2$ gas controlled by the MFC 552 may be set to a flow rate within a range from 0.1 slm to 30 slm. For example, a supply time (time duration) of supplying the $WF_6$ gas to the wafer 200 may be set to a time within a range from 0.01 second to 30 seconds. In the fifth step of the third embodiment, for example, the temperature of the heater 207 may be set such that the temperature of the wafer 200 is constantly maintained at substantially the same temperature as the film-forming temperature (which is the temperature of the wafer 200 in the film-forming step), for example, a temperature within a range from 300° C. to 500° C. However, the temperature of the wafer 200 in the fifth step of the third embodiment may be set to be different from the film-forming temperature.

In the fifth step of the third embodiment, the $WF_6$ gas and the $N_2$ gas are supplied into the process chamber 201 without any other gas being supplied into the process chamber 201 together with the $WF_6$ gas and the $N_2$ gas. By supplying the $WF_6$ gas, it is possible to remove (etch) the abnormal growth nuclei formed on the surface of the TiN film on the wafer 200. As a result, the surface of the TiN film is flattened.

<Purge Step>

<Residual Gas Removing Step, Sixth Step>

After a predetermined time has elapsed from a supply of the $WF_6$ gas, the valve 354 is closed to stop the supply of the $WF_6$ gas. In the sixth step, with the APC valve 243 of the exhaust pipe 231 open, the vacuum pump 246 vacuum-exhausts the inner atmosphere of the process chamber 201 to remove a residual gas in the process chamber 201 such as the $WF_6$ gas remaining in the process chamber 201 which did not react or which contributed to the removal of the abnormal growth nuclei and reaction by-products such as TiWFx out of the process chamber 201. In the sixth step, with the valve 554 open, the valves 514, 524, 534 and 544 are opened to supply the $N_2$ gas into the process chamber 201. The $N_2$ gas serves as the purge gas, which improves the efficiency of removing the $WF_6$ gas remaining in the process chamber 201 which did not react or which contributed to the removal of the abnormal growth nuclei and the reaction by-products such as the TiWFx out of the process chamber 201.

<Performing a Predetermined Number of Times>

By performing a cycle wherein (a) the predetermined number of executions (n times) of the film-forming step, (b) the abnormal growth nuclei removing step and (c) the purge step (that is, the sixth step) described above are sequentially performed in this order at least once (a predetermined number of times: m times), the abnormal growth nuclei formed on the wafer 200 are removed. Thereby, a multi-layer TiN film structure of a predetermined thickness (for example, 250 Å) constituted by the plurality of TiN films (each of which has the predetermined thickness of, for example, 100 Å) separated by an amorphous TiN film can be formed on the wafer 200.

That is, according to the present embodiment, each time the TiN film of a predetermined thickness (for example, 100 Å) is formed on the wafer 200, the abnormal growth nuclei formed on the wafer 200 are removed (etched). By removing the abnormal growth nuclei formed on the wafer 200, it is also possible to form a flattened TiN film of a predetermined thickness (for example, 250 Å). That is, it is possible to reduce the resistance of the W film formed on the surface of the TiN film.

Fourth Embodiment

Figure 7:
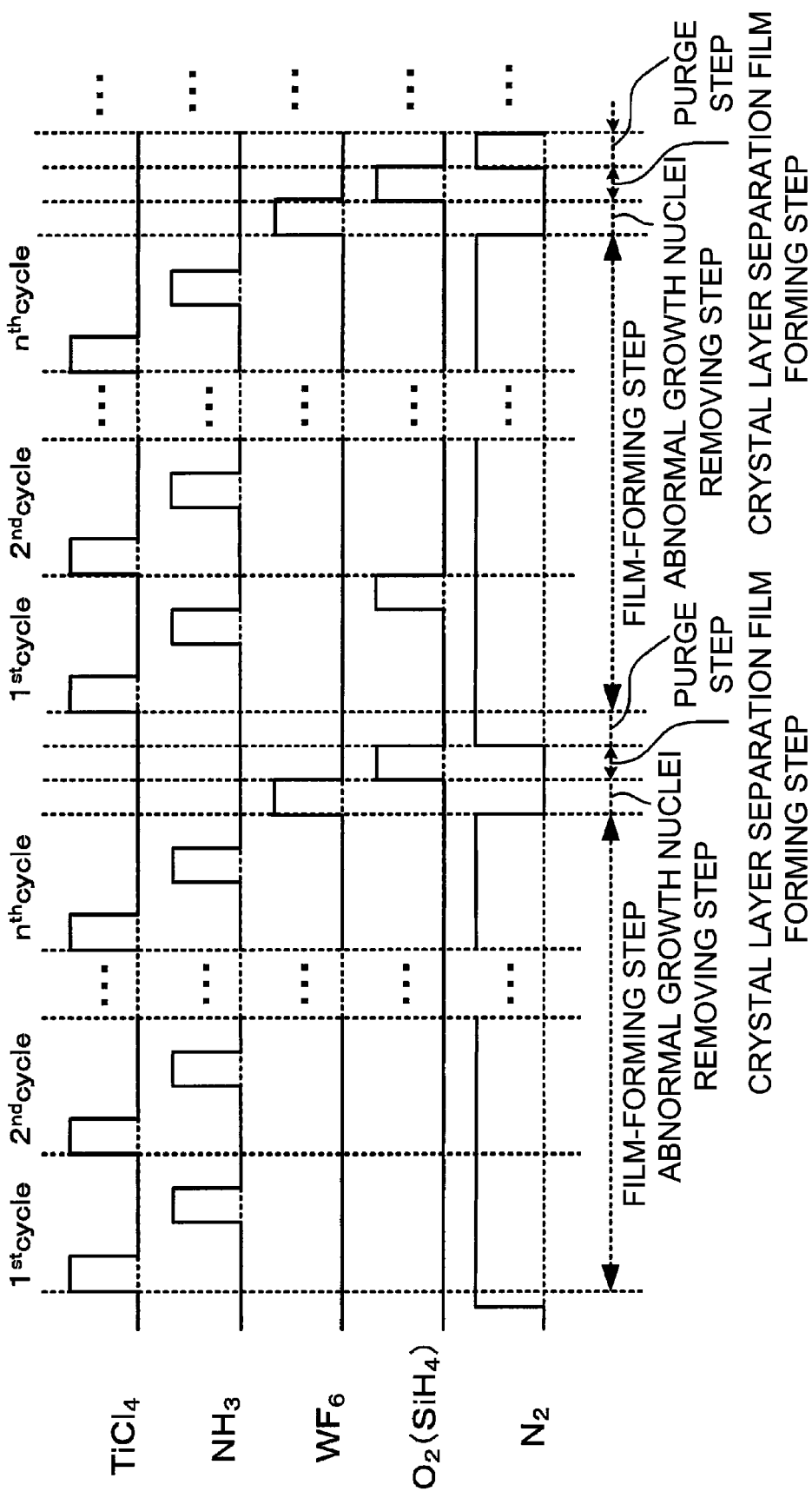
FIG. 7 is a diagram schematically illustrating a film-forming sequence according to a fourth embodiment of the present disclosure.

FIG. 7 is a diagram schematically illustrating a film-forming sequence according to a fourth embodiment. According to the present embodiment, after the abnormal growth nuclei removing step of the third embodiment, the crystal layer separation film forming step described above is performed. That is, according to the present embodiment, both of the abnormal growth nuclei removing step and the crystal layer separation film forming step are performed. Specifically, using the substrate processing apparatus 10 described above, the $WF_6$ gas supply step serving as the abnormal growth nuclei removing step of the third embodiment is performed, and thereafter, the $O_2$ gas supply step serving as the crystal layer separation film forming step of the first embodiment described above or the $SiH_4$ gas supply step serving as the crystal layer separation film forming step of the second embodiment described above is performed.

<Performing a Predetermined Number of Times>

By performing a cycle wherein (a) the predetermined number of executions (n times) of the film-forming step, (b) the abnormal growth nuclei removing step, (c) the crystal layer separation film forming step and (d) the purge step (that is, the sixth step) described above are sequentially performed in this order at least once (a predetermined number of times: m times), the abnormal growth nuclei formed on the wafer 200 are removed. Thereby, a multi-layer TiN film structure of a predetermined thickness (for example, 250 Å) constituted by the plurality of TiN films (each of which has the predetermined thickness of, for example, 100 Å) separated by the crystal layer separation film can be formed on the wafer 200.

That is, according to the present embodiment, each time the TiN film of a predetermined thickness (for example, 100 Å) is formed on the wafer 200, the abnormal growth nuclei formed on the wafer 200 are removed and the crystal layer separation film is formed. Thereby, the crystal growth on the surface of the TiN film can be suppressed after the abnormal growth nuclei formed on the surface of the wafer 200 are removed. As a result, it is possible to suppress the formation of the abnormal growth nuclei, and it is also possible to form a flattened TiN film of a predetermined thickness (for example, 250 Å). That is, it is possible to reduce the resistance of the W film formed on the surface of the TiN film.

Modified Example

Figure 8:
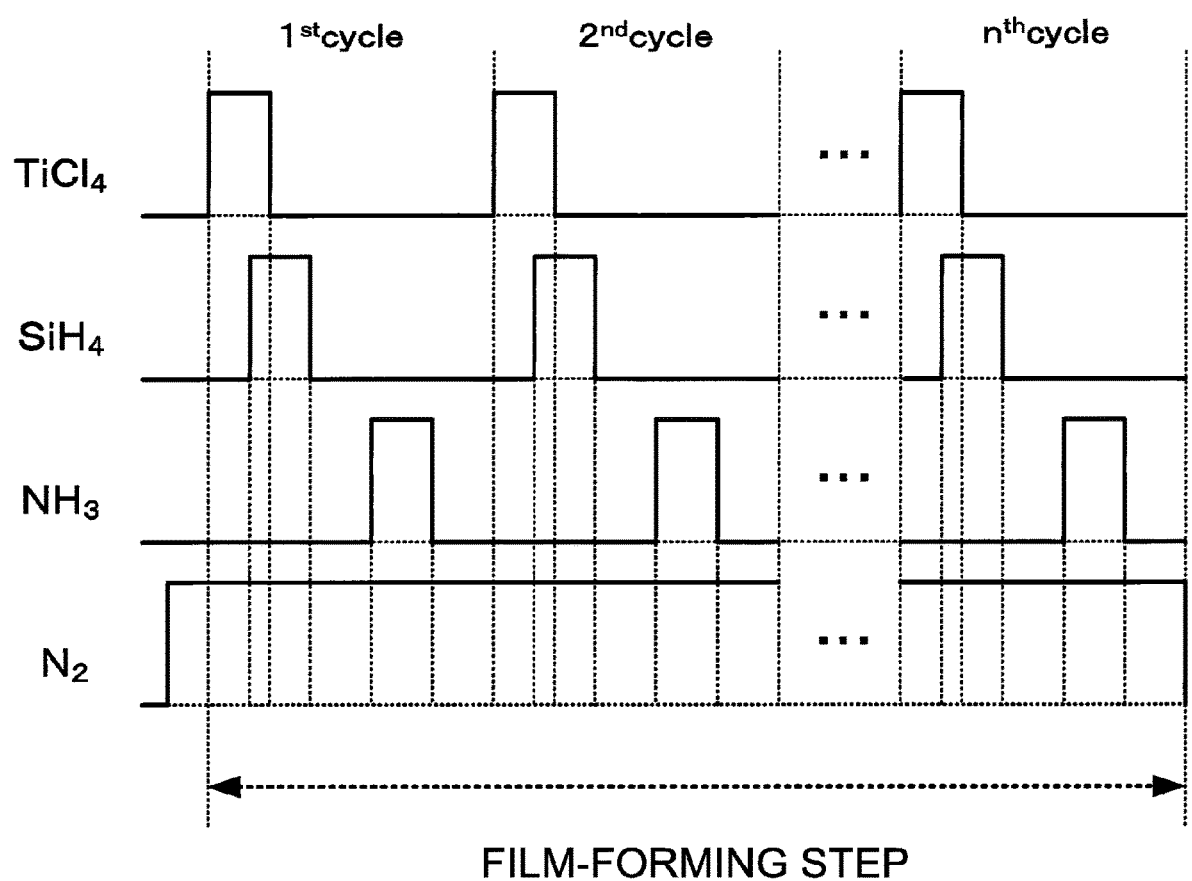
FIG. 8 is a diagram schematically illustrating a modified example of a film-forming step in the film-forming sequences according to the embodiments of the present disclosure.

Subsequently, a modified example of the film-forming step in the film-forming sequences according to the embodiments of the present disclosure will be described with reference to FIG. 8.

The film-forming step of the present modified example is different from that in the film-forming sequences of the embodiments described above. Specifically, according to the present modified example, the $SiH_4$ gas is supplied during the $TiCl_4$ gas supply step (that is, the first step) in the film-forming step of the embodiments described above.

<Film-Forming Step>

The film-forming step is performed by performing a cycle including a first step, a second step, a third step and a fourth step described below a predetermined number of times (n times).

<$TiCl_4$ Gas Supply Step, First Sub-Step of First Step>

The $TiCl_4$ gas is supplied into the process chamber 201 in substantially the same manners as in the $TiCl_4$ gas supply step (that is, the first step) in the film-forming step of the embodiments described above. In the first sub-step of the first step, the $TiCl_4$ gas and the $N_2$ gas are supplied into the process chamber 201 without any other gas being supplied into the process chamber 201 together with the $TiCl_4$ gas and the $N_2$ gas. By supplying the $TiCl_4$ gas, the titanium-containing layer is formed on the wafer 200 (that is, on the base film on the surface of the wafer 200).

<$SiH_4$ Gas Supply Step, Second Sub-Step of First Step>

After a predetermined time (for example, from 0.01 second to 5 seconds) has elapsed from the supply of the $TiCl_4$ gas, the valve 324 is opened to supply the $SiH_4$ gas serving as the silicon-containing gas and also serving as a reducing gas into the gas supply pipe 320. The flow rate of the $SiH_4$ gas supplied into the gas supply pipe 320 is adjusted by the MFC 322. The $SiH_4$ gas whose flow rate is adjusted is then supplied into the process chamber 201 through the gas supply holes 420a of the nozzle 420, and is exhausted through the exhaust pipe 231. When the $SiH_4$ gas is supplied, simultaneously, the valve 524 may be opened to supply the inert gas such as the $N_2$ gas into the gas supply pipe 520. The flow rate of the $N_2$ gas supplied into the gas supply pipe 520 is adjusted by the MFC 522. The $N_2$ gas whose flow rate is adjusted is then supplied into the process chamber 201 together with the $SiH_4$ gas, and is exhausted through the exhaust pipe 231. In addition, in order to prevent the $TiCl_4$ gas and the $SiH_4$ gas from entering the nozzles 430, 440 and 450, the valves 534, 544 and 554 may be opened to supply the $N_2$ gas into the gas supply pipes 530, 540 and 550. Thereby, the $TiCl_4$ gas, the $SiH_4$ gas and the $N_2$ gas are simultaneously supplied to the wafers 200. That is, in the second sub-step of the first step, there is a timing at which at least the $TiCl_4$ gas and the $SiH_4$ gas are simultaneously supplied.

In the second sub-step of the first step, for example, the APC valve 243 is appropriately controlled to adjust the inner pressure of the process chamber 201 to a pressure within a range from 130 Pa to 3,990 Pa. When the inner pressure of the process chamber 201 is lower than 130 Pa, silicon contained in the $SiH_4$ gas may enter the titanium-containing layer so as to increase the silicon content in the TiN film to be formed. Thereby, a titanium silicon nitride film (TiSiN film) may be formed instead of the TiN film. Similarly, when the inner pressure of the process chamber 201 is higher than 3,990 Pa, silicon contained in the $SiH_4$ gas may enter the titanium-containing layer so as to increase the silicon content in the TiN film to be formed. Thereby, the titanium silicon nitride film (TiSiN film) may be formed instead of the TiN film. As described above, when the inner pressure of the process chamber 201 is too low or too high, an elemental composition of the film to be formed may change. For example, the supply flow rate of the $SiH_4$ controlled by the MFC 322 may be set to a flow rate within a range from 0.1 slm to 5 slm. For example, the supply flow rates of the $N_2$ gas controlled by the MFCs 512, 522, 532, 542 and 552 may be set to flow rates within a range from 0.01 slm to 20 slm, respectively. In the second sub-step of the first step, for example, the temperature of the heater 207 may be set to substantially the same temperature as that of the $TiCl_4$ gas supply step.

After a predetermined time (for example, from 0.01 second to 10 seconds) has elapsed from the supply of the $TiCl_4$ gas, the valve 314 of the gas supply pipe 310 is closed to stop the supply of the $TiCl_4$ gas. In addition, in order to prevent the $SiH_4$ gas from entering the nozzle 410, with the valve 514 open, the $N_2$ gas is supplied into the gas supply pipes 510, 530, 540 and 550. The $N_2$ gas is then supplied into the process chamber 201 through the gas supply pipes 320, 330, 340 and 350, the nozzles 410, 430, 440 and 450, and is exhausted through the exhaust pipe 231. Thereby, the $SiH_4$ gas and the $N_2$ gas are supplied to the wafers 200.

<Residual Gas Removing Step, Second Step>

After a predetermined time (for example, from 0.01 second to 60 seconds) has elapsed from the supply of the $SiH_4$ gas, the valve 324 is closed to stop the supply of the $SiH_4$ gas. In the second step, with the APC valve 243 of the exhaust pipe 231 open, the vacuum pump 246 vacuum-exhausts the inner atmosphere of the process chamber 201 to remove a residual gas in the process chamber 201 such as the $TiCl_4$ gas and the $SiH_4$ gas remaining in the process chamber 201 which did not react or which contributed to the formation of the titanium-containing layer out of the process chamber 201. In the second step, with the valves 514, 524, 534, 544 and 554 open, the $N_2$ gas is continuously supplied into the process chamber 201. The $N_2$ gas serves as the purge gas, which improves the efficiency of removing the $TiCl_4$ gas and the $SiH_4$ gas remaining in the process chamber 201 which did not react or which contributed to the formation of the titanium-containing layer out of the process chamber 201. In the second step, HCl (which is a growth inhibitor) reacts with the $SiH_4$ gas and is discharged from the process chamber 201 as silicon tetrachloride ($SiCl_4$) and hydrogen ($H_2$) gas.

<$NH_3$ Gas Supply Step, Third Step>

After the residual gas in the process chamber 201 is removed, the $NH_3$ gas is supplied into the process chamber 201 in substantially the same manners as in the third step in the film-forming step of the embodiments described above.

<Residual Gas Removing Step, Fourth Step>

After a predetermined time has elapsed from the supply of the $NH_3$ gas, the valve 334 is closed to stop the supply of the $NH_3$ gas. In the fourth step, with the APC valve 243 of the exhaust pipe 231 open, the vacuum pump 246 vacuum-exhausts the inner atmosphere of the process chamber 201 to remove a residual gas in the process chamber 201 such as the $NH_3$ gas remaining in the process chamber 201 which did not react or which contributed to the formation of the TiN layer and the reaction byproducts out of the process chamber 201 in substantially the same manners as in the fourth step in the film-forming step of the embodiments described above.

<Performing a Predetermined Number of Times>

By performing the cycle wherein the first step, the second step, the third step and the fourth step of the modified example described above are sequentially performed in this order the predetermined number of times (n times), the TiN film of a predetermined thickness (for example, 100 Å) is formed on the wafer 200.

According to the present modified example, by performing one or both of the crystal layer separation film forming step and the abnormal growth nuclei removing step similar to the embodiments described above, it is possible to obtain substantially the same effects as those of the film-forming sequences shown in FIGS. 4 through 7.

In addition, while the embodiments described above are described by way of an example in which the TiN film is formed, the technique of the present disclosure is not limited thereto. For example, the technique of the present disclosure may also be applied to form another metal film other than the TiN film. For example, as a metal element, an element such as tungsten (W), tantalum (Ta), ruthenium (Ru), molybdenum (Mo), zirconium (Zr), hafnium (Hf), aluminum (Al), silicon (Si), germanium (Ge) and gallium (Ga), an element of the same family as the elements described above, or a transition metal may be used. For example, the technique of the present disclosure may also be applied to form a film containing one of the elements described above alone, a compound film of the elements described above and nitrogen (that is, a nitride film) or a compound film of the elements described above and oxygen (that is, an oxide film). When forming the films described above, the halogen-containing gas described above or a gas containing at least one of the halogen element, an amino group, a cyclopentane group or oxygen (O) may be used.

In addition, while the embodiments described above are described by way of an example in which the $O_2$ gas is used as the oxygen-containing gas in the crystal layer separation film forming step, the technique of the present disclosure is not limited thereto. For example, the technique of the present disclosure may also be applied when a gas such as the ozone ($O_3$) gas, the nitric oxide (NO) gas and the nitrous oxide ($N_2O$) gas is used as the oxygen-containing gas. In addition, in the crystal layer separation film forming step using the oxygen-containing gas, it is preferable to diffuse the oxygen atoms into the TiN film. Therefore, it is preferable to use the oxygen-containing gas such as the $O_2$ gas, the $O_3$ gas, the NO gas and the $N_2O$ gas rather than water vapor ($H_2O$) containing hydrogen atoms.

In addition, while the embodiments described above are described by way of an example in which the oxidation process using the oxygen-containing gas is performed as a process of the crystal layer separation film forming step, the technique of the present disclosure is not limited thereto. For example, by performing a nitriding process using the nitrogen-containing gas, it is also possible to separate the crystal layer. For example, a gas such as the ammonia ($NH_3$) gas and a mixed gas of nitrogen ($N_2$) gas and the hydrogen ($H_2$) gas may be used as the nitrogen-containing gas. In addition, active species of the gases described above may be used as the nitrogen-containing gas.

In addition, while the embodiments described above are described by way of an example in which the $SiH_4$ gas is used as the silicon-containing gas in the crystal layer separation film forming step, the technique of the present disclosure is not limited thereto. For example, the technique of the present disclosure may also be applied when the silane-based gas or the chlorosilane-based gas such as the hexachlorodisilane ($Si_2Cl_6$) gas is used as the silicon-containing gas.

In addition, while the embodiments described above are described by way of an example in which the $WF_6$ gas (which contains a halogen element and a metal element) is used as the halogen-containing gas in the abnormal growth nuclei removing step, the technique of the present disclosure is not limited thereto. For example, the technique of the present disclosure may also be applied when a halogen-containing gas free of a metal element is used. As the halogen-containing gas free of the metal element, for example, a gas such as the $NF_3$ gas, the $ClF_3$ gas, the $F_2$ gas and the HF gas may be used. For example, as the halogen element, an element such as chlorine (Cl), fluorine (F) and bromine (Br) may be used, and as the metal element, an element such as W, Ti, Ta, Mo, Zr, Hf, Al, Si, Ge and Ga may be used. That is, the technique of the present disclosure may also be applied when a gas containing at least one among the elements described above is used as the halogen-containing gas. In addition, the halogen-containing gas may further contain oxygen (O) atom. For example, a gas such as molybdenum dichloride dioxide ($MoO_2Cl_2$) gas and molybdenum oxytetrachloride ($MoOCl_4$) gas may be used as the halogen-containing gas.

In addition, while the embodiments described above are described by way of an example in which a vertical batch type substrate processing apparatus configured to simultaneously process a plurality of substrates is used to form the film, the technique of the present disclosure is not limited thereto. For example, the technique of the present disclosure may also be preferably applied when a single wafer type substrate processing apparatus configured to simultaneously process one or several substrates is used to form the film.

Figure 9A:
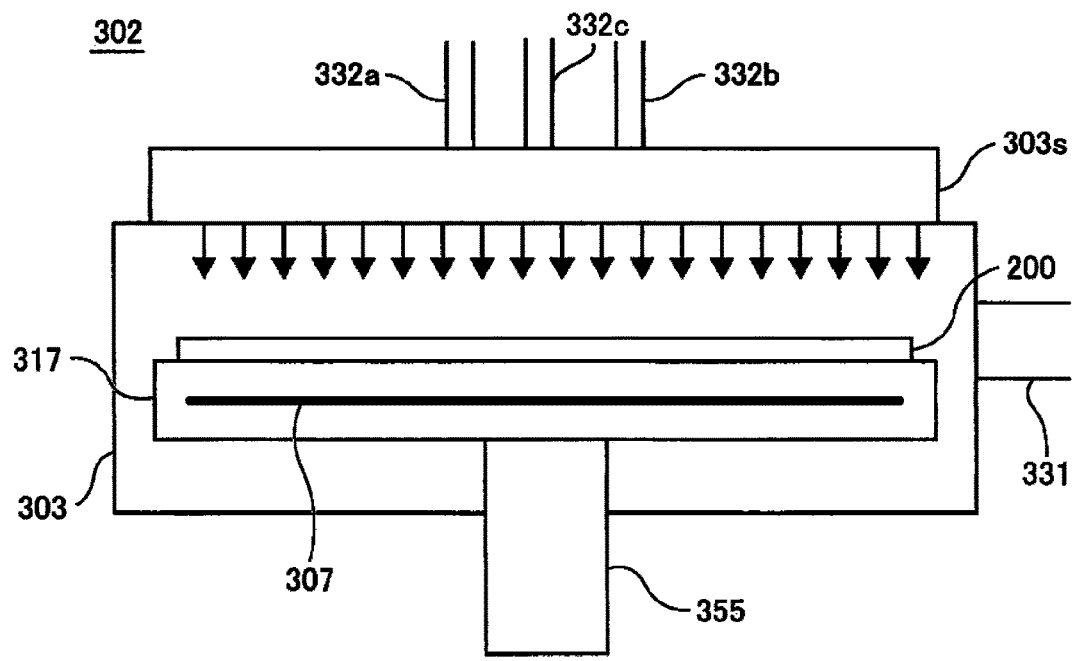
FIG. 9A is a diagram schematically illustrating a vertical cross-section of a process furnace of a substrate processing apparatus according to another embodiment of the present disclosure.

For example, the technique of the present disclosure may also be preferably applied when a film is formed by using a substrate processing apparatus including a process furnace 302 shown in FIG. 9A. The process furnace 302 may include: a process vessel 303 defining a process chamber 301 therein; a shower head 303s through which a gas is supplied in a shower-like manner into the process chamber 301; a support plate 317 configured to support one or several wafers 200 in a horizontal orientation; a rotating shaft 355 configured to support the support plate 317 from thereunder; and a heater 307 provided in the support plate 317. A gas supply port 332a through which the source gas described above is supplied, a gas supply port 332b through which the reactive gas described above is supplied and a gas supply port 332c through which a gas such as the oxygen-containing gas, the silicon-containing gas and the halogen-containing gas is supplied are connected to an inlet (gas introduction port) of the shower head 303s. A source gas supplier similar to the source gas supplier of the embodiments described above is connected to the gas supply port 332a. A reactive gas supplier similar to the reactive gas supplier of the embodiments described above is connected to the gas supply port 332b. A gas supplier similar to the oxygen-containing gas supplier, the silicon-containing gas supplier or the halogen-containing gas supplier of the embodiments described above is connected to the gas supply port 332c. A gas distribution plate (not shown) through which the gas is supplied in a shower-like manner into the process chamber 301 is provided at an outlet (gas discharge port) of the shower head 303s. An exhaust port 331 through which an inner atmosphere of the process chamber 301 is exhausted is provided at the process vessel 303. An exhauster (not shown) similar to the exhauster of the embodiments described above is connected to the exhaust port 331.

Figure 9B:
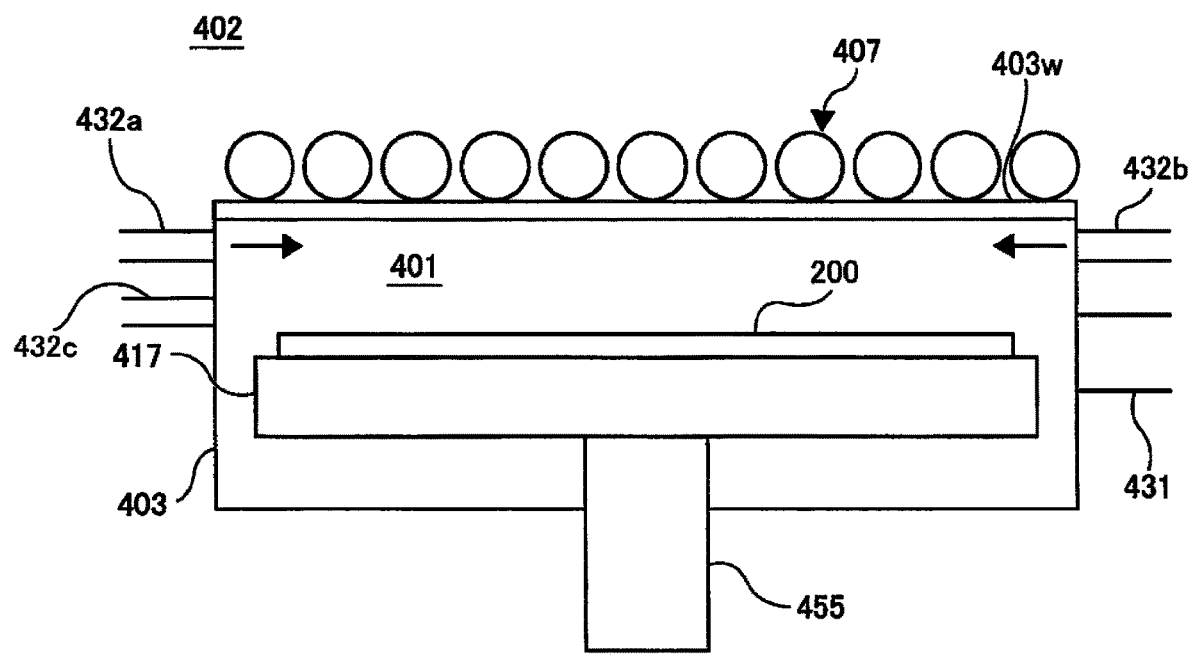
FIG. 9B is a diagram schematically illustrating a vertical cross-section of a process furnace of a substrate processing apparatus according to still another embodiment of the present disclosure.

For example, the technique of the present disclosure may also be preferably applied when a film is formed by using a substrate processing apparatus including a process furnace 402 shown in FIG. 9B. The process furnace 402 may include: a process vessel 403 defining a process chamber 401; a support plate 417 configured to support one or several wafers 200 in a horizontal orientation; a rotating shaft 455 configured to support the support plate 417 from thereunder; a lamp heater 407 configured to irradiate light to the wafer 200 or the wafers 200 in the process vessel 403; and a quartz window 403w through which the light of the lamp heater 407 is transmitted. A gas supply port 432a through which the source gas described above is supplied, a gas supply port 432b through which the reactive gas described above is supplied and a gas supply port 432c through which a gas such as the oxygen-containing gas, the silicon-containing gas and the halogen-containing gas is supplied are connected to the process vessel 403. A source gas supplier similar to the source gas supplier of the embodiments described above is connected to the gas supply port 432a. A reactive gas supplier similar to the reactive gas supplier of the embodiments described above is connected to the gas supply port 432b. A gas supplier similar to the oxygen-containing gas supplier, the silicon-containing gas supplier or the halogen-containing gas supplier of the embodiments described above is connected to the gas supply port 432c. An exhaust port 431 through which an inner atmosphere of the process chamber 401 is exhausted is provided at the process vessel 403. An exhauster (not shown) similar to the exhauster of the embodiments described above is connected to the exhaust port 431.

When the substrate processing apparatuses described above are used to perform the film-forming step, process sequences and process conditions may be substantially the same as those of the embodiments described above.

It is preferable that the process recipe (that is, a program defining parameters such as the process sequences and the process conditions of the substrate processing) used to form the above-described various films is prepared individually according to the contents of the substrate processing such as a type of the film to be formed, a composition ratio of the film, a quality of the film, a thickness of the film, the process sequences and the process conditions of the substrate processing. That is, a plurality of process recipes are prepared individually. When starting the substrate processing, an appropriate process recipe is preferably selected among the plurality of process recipes in accordance with the contents of the substrate processing. Specifically, it is preferable that the plurality of process recipes are stored (installed) in the memory 121c of the substrate processing apparatus 10 in advance via an electric communication line or the recording medium (the external memory 123) storing the plurality of process recipes. Then, when starting the substrate processing, the CPU 121a preferably selects the appropriate process recipe among the plurality of process recipes stored in the memory 121c of the substrate processing apparatus 10 in accordance with the contents of the substrate processing. Thus, various films of different types, composition ratios, different qualities and different thicknesses may be universally formed with a high reproducibility using a single substrate processing apparatus. In addition, since a burden on an operator such as inputting the process sequences and the process conditions may be reduced, various substrate processes may be performed quickly while avoiding a malfunction of the apparatus.

The technique of the present disclosure may also be implemented by changing an existing process recipe stored in the substrate processing apparatus to a new process recipe. When changing the existing process recipe to the new process recipe, the new process recipe according to the technique of the present disclosure may be installed in the substrate processing apparatus via the electric communication line or the recording medium storing the plurality of process recipes. The existing process recipe itself already stored in the substrate processing apparatus may also be directly changed to the new process recipe according to the technique of the present disclosure by operating the input/output device of the substrate processing apparatus.

The technique of the present disclosure may be applied to, for example, a word line of a DRAM or a NAND flash memory of a three-dimensional structure.

As described above, the technique of the present disclosure is described in detail by way of the embodiments and the modified example. However, the technique of the present disclosure is not limited thereto. The embodiments and the modified example described above may be appropriately combined.

(4) Examples of Embodiments

Figure 4:
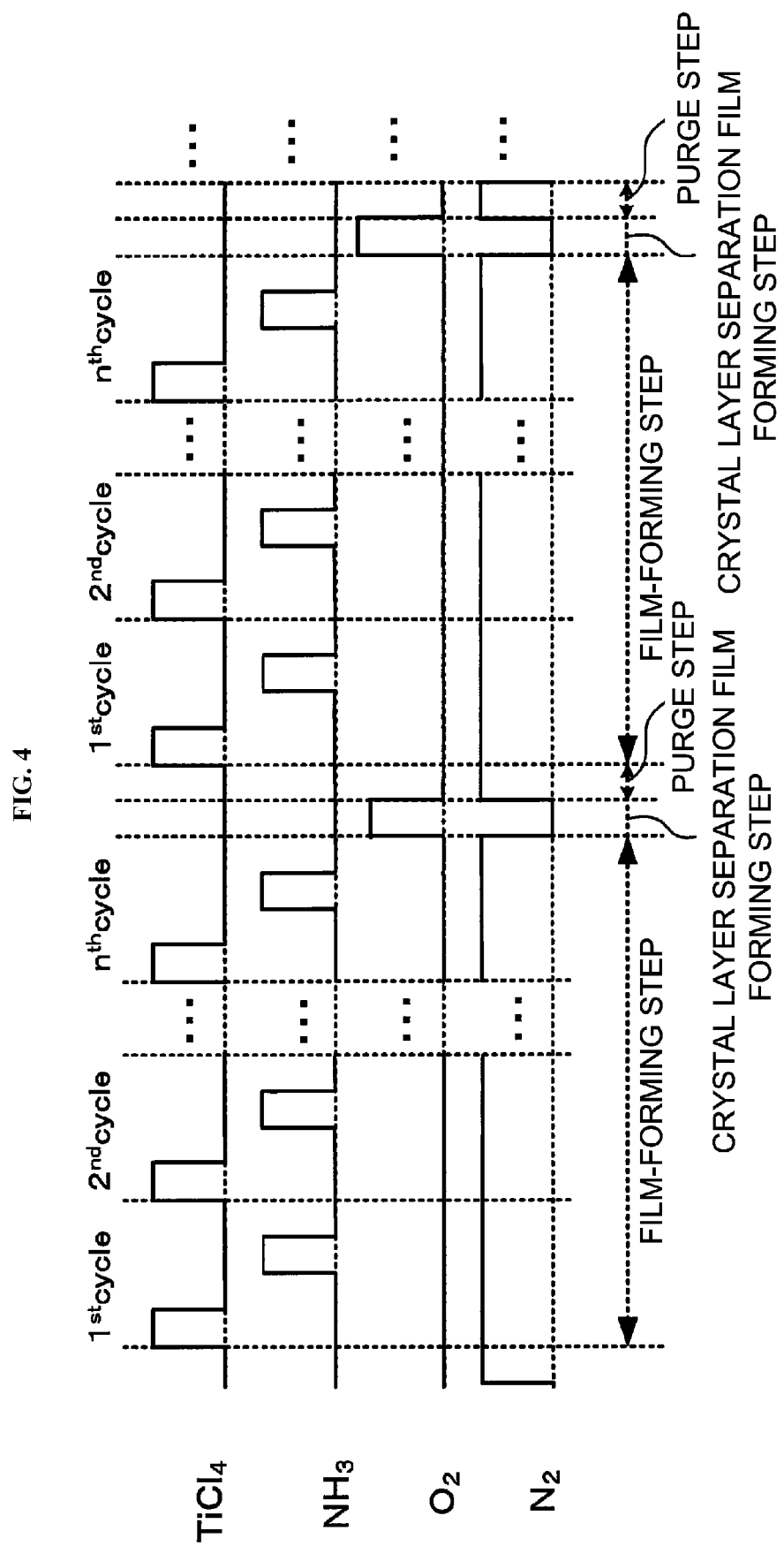
FIG. 4 is a diagram schematically illustrating a film-forming sequence according to a first embodiment of the present disclosure.

In a comparative example shown in FIG. 10, a cross-section of the wafer 200 when the TiN film of a thickness of 250 Å is formed on the wafer 200 by performing the film-forming step shown in FIG. 4 by using the substrate processing apparatus 10 described above is illustrated. In a first example shown in FIG. 10, a cross-section of the wafer 200 when the TiN film of a thickness of 250 Å is formed on the wafer 200 by performing the film-forming sequence (in which the $O_2$ gas supply step is performed each time the TiN film of a thickness of 100 Å is formed) shown in FIG. 4 by using the substrate processing apparatus 10 described above is illustrated. In a second example shown in FIG. 10, a cross-section of the wafer 200 when the TiN film of a thickness of 250 Å is formed on the wafer 200 by performing the film-forming sequence (in which the $SiH_4$ gas supply step is performed each time the TiN film of a thickness of 100 Å is formed) shown in FIG. 5 by using the substrate processing apparatus 10 described above is illustrated. In a third example shown in FIG. 10, a cross-section of the wafer 200 when the TiN film of a thickness of 250 Å is formed on the wafer 200 by performing the film-forming sequence (in which the $WF_6$ gas supply step is performed each time the TiN film of a thickness of 100 Å is formed) shown in FIG. 6 by using the substrate processing apparatus 10 described above is illustrated.

Then, the cross-sections of the TiN films formed in the comparative example and the first through third examples are observed using an atomic force microscope. As shown in FIG. 10, it is confirmed that the abnormal growth nuclei are formed on the surface of the TiN film of the comparative example. A root mean square roughness ("Rms") of the TiN film is 1.62 nm, and a maximum height difference ("Rmax") is 25.7 nm in the comparative example. On the other hand, it is confirmed that the surface of the TiN film of the first example is flattened. It is confirmed that three TiN layers are stacked in the TiN film of the first example, and the crystal layer separation film is formed between the three TiN layers of the first example. The root mean square roughness (Rms) of the TiN film is 0.91 nm, and the maximum height difference (Rmax) is 9.79 nm in the first example. In addition, it is confirmed that the surface of the TiN film of the second example is flattened. It is confirmed that three TiN layers are stacked in the TiN film of the second example, and the crystal layer separation film is formed between the three TiN layers of the second example. The root mean square roughness (Rms) of the TiN film is 0.80 nm, and the maximum height difference (Rmax) is 9.56 nm in the second example. In addition, it is confirmed that the surface of the TiN film of the third example is flattened. It is confirmed that three TiN layers separated by the amorphous TiN film are stacked in the TiN film of the third example. The root mean square roughness (Rms) of the TiN film is 1.00 nm, and the maximum height difference (Rmax) is 11.3 nm in the third example.

That is, it is confirmed that, by performing one or both of the crystal layer separation film forming step and the abnormal growth nuclei removing step each time the TiN film of a thickness of 100 Å is formed on the wafer 200 by performing the film-forming step of the TiN film, it is possible to form a sufficiently flat TiN film of a thickness of 250 Å.

According to some embodiments of the present disclosure, it is possible to form the sufficiently flat film.

What is claimed is:

1. A substrate processing method comprising
   (a) forming a metal-containing film on the substrate by performing:
      (a1) supplying a material gas containing metal and halogen to the substrate;
      (a2) supplying a silicon-containing gas to the substrate while performing (a1); and
      (a3) supplying a reactive gas to the substrate,
      wherein (a1), (a2) and (a3) are performed a predetermined number of times in (a);
   (b) supplying the silicon-containing gas to the substrate so as to perform:
      (b-1) forming a first film on a surface of the metal-containing film; and
   (c) forming a metal-containing multi-layer film structure on the substrate by alternately performing (a) and (b).

2. The substrate processing method of claim 1, wherein, in (b), a pressure of a space in which the substrate is present when the silicon-containing gas is supplied is set to be different for each execution of the cycle.

3. The substrate processing method of claim 2, wherein, in (b), the pressure of the space in which the substrate is present when the silicon-containing gas is supplied is controlled to increase as number of executions of the cycle increases.

4. The substrate processing method of claim 1, wherein (b) further comprises:
   (b-2) removing an abnormal growth nuclei generated in (a) by supplying a process gas comprising a removing gas.

5. The substrate processing method of claim 4, wherein (b-1) is performed after (b-2) in (b).

6. The substrate processing method of claim 4, wherein (b-1) and (b-2) are repeatedly performed in (b).

7. The substrate processing method of claim 1, wherein the metal-containing film is formed on the substrate in (a) by supplying the material gas containing metal and halogen and a reducing gas to the substrate a predetermined number of times or by supplying the material gas, a silane-based gas and the reducing gas to the substrate a predetermined number of times.

8. The substrate processing method of claim 1, wherein the silicon-containing gas comprises a silane-based gas.

9. The substrate processing method of claim 1, wherein the silicon-containing gas comprises a chlorosilane-based gas.

10. The substrate processing method of claim 4, wherein a halogen-containing gas is supplied as the process gas in (b-2).

11. The substrate processing method of claim 10, wherein the halogen-containing gas comprises at least one of nitrogen trifluoride gas, tungsten hexafluoride gas, chlorine trifluoride gas, fluorine gas or hydrogen fluoride gas.

12. A method of manufacturing a semiconductor device comprising the substrate processing method of claim 1.

13. The substrate processing method of claim 1, wherein the silicon-containing gas comes into contact with the surface of the metal-containing film formed in (a).

14. The substrate processing method of claim 1, wherein an amount of silicon contained in the metal-containing film is lower than that of silicon contained in the first film formed in (b-1).

15. The substrate processing method of claim 1, wherein the metal-containing film comprises a crystal layer, and
   wherein the first film formed in (b-1) is of an amorphous state.

16. The substrate processing method of claim 1, wherein, in (b), a pressure of a space where the substrate is present during the silicon-containing gas being supplied is to be changed as number of executions of the cycle increases.

17. A non-transitory computer-readable recording medium storing a program that causes, by a computer, a substrate processing apparatus to perform:
   (a) forming a metal-containing film on a substrate by performing:
      (a1) supplying a material gas containing metal and halogen to the substrate;
      (a2) supplying a silicon-containing gas to the substrate while performing (a1); and
      (a3) supplying a reactive gas to the substrate,
      wherein (a1), (a2) and (a3) are performed a predetermined number of times in (a);
   (b) supplying the silicon-containing gas to the substrate so as to perform:
      (b-1) forming a first film on a surface of the metal-containing film; and
   (c) forming a metal-containing multi-layer film structure on the substrate by alternately performing (a) and (b).

* * * * *